(12) United States Patent
Ahn et al.

(10) Patent No.: US 11,935,597 B2
(45) Date of Patent: Mar. 19, 2024

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Jaeho Ahn, Suwon-si (KR); Jiwon Kim, Suwon-si (KR); Sungmin Hwang, Suwon-si (KR); Joonsung Lim, Suwon-si (KR); Sukkang Sung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 204 days.

(21) Appl. No.: 17/523,337

(22) Filed: Nov. 10, 2021

(65) Prior Publication Data

US 2022/0157382 A1 May 19, 2022

(30) Foreign Application Priority Data

Nov. 19, 2020 (KR) ........................ 10-2020-0155461

(51) Int. Cl.
*G11C 16/04* (2006.01)
*G11C 16/10* (2006.01)
(Continued)

(52) U.S. Cl.
CPC .............. *G11C 16/10* (2013.01); *G11C 16/26* (2013.01); *H01L 23/481* (2013.01); *H10B 41/27* (2023.02);
(Continued)

(58) Field of Classification Search
CPC ............. H01L 23/481; H01L 21/76898; H01L 2224/73265; H01L 25/0657; H10B 41/40;
(Continued)

(56) References Cited

U.S. PATENT DOCUMENTS 10,090,315 B2  10/2018 Fukuzumi et al.
10,553,612 B2   2/2020 Tagami et al.
(Continued)

FOREIGN PATENT DOCUMENTS

CN    110379811 A    10/2019
CN    110574162 A    12/2019
(Continued)

*Primary Examiner* — Uyen Smet
(74) *Attorney, Agent, or Firm* — Fish & Richardson P.C.

(57) ABSTRACT

A semiconductor memory device includes: a semiconductor substrate having a first surface and a second surface opposing each other; a back-side insulating layer below the second surface of the semiconductor substrate; an external input/output conductive pattern below the back-side insulating layer; a circuit device including a gate electrode and a source/drain region, on the first surface of the semiconductor substrate; an internal input/output conductive pattern on the first surface of the semiconductor substrate, the internal input/output conductive pattern having at least a portion disposed on the same level as at least a portion of the gate electrode; a through-electrode structure penetrating through the semiconductor substrate and the back-side insulating layer and electrically connected to the internal input/output conductive pattern and the external input/output conductive pattern; and a memory cell array region disposed on a level higher than the circuit device, on the first surface of the semiconductor substrate.

20 Claims, 36 Drawing Sheets

(51) Int. Cl.
   *G11C 16/26* (2006.01)
   *H01L 23/48* (2006.01)
   *H10B 41/27* (2023.01)
   *H10B 41/35* (2023.01)
   *H10B 41/40* (2023.01)
   *H10B 43/27* (2023.01)
   *H10B 43/35* (2023.01)
   *H10B 43/40* (2023.01)

(52) U.S. Cl.
   CPC ............. *H10B 41/35* (2023.02); *H10B 41/40* (2023.02); *H10B 43/27* (2023.02); *H10B 43/35* (2023.02); *H10B 43/40* (2023.02)

(58) Field of Classification Search
   CPC ........ H10B 43/40; H10B 43/50; H10B 41/35; H10B 43/35
   See application file for complete search history.

(56) References Cited

U.S. PATENT DOCUMENTS

| | | | |
|---|---|---|---|
| 10,629,616 | B1 | 4/2020 | Kai et al. |
| 2014/0162449 | A1* | 6/2014 | An .................... H01L 21/76885 |
| | | | 438/613 |
| 2018/0277497 | A1 | 9/2018 | Matsuo |
| 2019/0043868 | A1 | 2/2019 | Hasnat et al. |
| 2019/0088589 | A1 | 3/2019 | Zhu et al. |
| 2019/0312012 | A1 | 10/2019 | Tagami et al. |
| 2020/0058669 | A1 | 2/2020 | Chen et al. |
| 2020/0098776 | A1 | 3/2020 | Sugisaki |
| 2020/0144242 | A1 | 5/2020 | Park |
| 2020/0258817 | A1* | 8/2020 | Okina .................... H10B 43/40 |
| 2020/0279841 | A1 | 9/2020 | Sanuki |
| 2021/0036006 | A1 | 2/2021 | Chen et al. |

FOREIGN PATENT DOCUMENTS

| | | |
|---|---|---|
| CN | 111180344 A | 5/2020 |
| CN | 210443557 U | 5/2020 |

* cited by examiner

B1

SEMICONDUCTOR DEVICE AND DATA STORAGE SYSTEM INCLUDING THE SAME

CROSS-REFERENCE TO RELATED APPLICATION(S)

This application claims benefit of priority to Korean Patent Application No. 10-2020-0155461 filed on Nov. 19, 2020 in the Korean Intellectual Property Office, the disclosure of which is incorporated herein by reference in its entirety.

BACKGROUND

The present disclosure relates to a semiconductor device and a data storage system including the same.

There has been demand for a semiconductor device for storing high-capacity data in a data storage system requiring data storage. Accordingly, there has been research into measures for increasing the data storage capacity of a semiconductor device. For example, as a method of increasing data storage capacity of a semiconductor device, a semiconductor device including three-dimensionally arranged memory cells, rather than two-dimensionally arranged memory cells, has been suggested.

SUMMARY

Example embodiments provide a semiconductor device which may improve integration density and reliability.

Example embodiments provide a data storage system including a semiconductor device.

According to an example embodiment, a semiconductor device is provided. The semiconductor device includes a first structure and a second structure on the first structure. The first structure includes a semiconductor substrate having a first surface and a second surface opposing each other, a front side structure on the first surface of the semiconductor substrate and a back side structure below the second surface of the semiconductor substrate, and a through-electrode structure including a portion penetrating through the semiconductor substrate. The second structure includes gate layers, stacked in a vertical direction and a vertical memory structure penetrating through the gate layers. The front side structure includes a first circuit device, including a first gate structure including a gate dielectric layer and a gate electrode stacked in order and a first source/drain region, and an internal input/output conductive pattern having a portion disposed on the same level as at least a portion of the gate electrode. The back side structure includes a back side insulating layer below the second surface of the semiconductor substrate and an external input/output conductive pattern below the back side insulating layer. The through-electrode structure includes a through-electrode, electrically connected to the external input/output conductive pattern and the internal input/output conductive pattern, and an insulating spacer on a side surface of the through-electrode.

According to an example embodiment, a semiconductor device includes: a semiconductor substrate having a first surface and a second surface opposing each other; a back side insulating layer below the second surface of the semiconductor substrate; an external input/output conductive pattern below the back side insulating layer; a circuit device including a gate electrode and a source/drain region, on the first surface of the semiconductor substrate; an internal input/output conductive pattern on the first surface of the semiconductor substrate, the internal input/output conductive pattern having at least a portion disposed on the same level as at least a portion of the gate electrode; a through-electrode structure penetrating through the semiconductor substrate and the back side insulating layer and electrically connected to the internal input/output conductive pattern and the external input/output conductive pattern; and a memory cell array region disposed on a level higher than the circuit device, on the first surface of the semiconductor substrate.

According to an example embodiment, a data storage system includes: a main substrate; a semiconductor device on the main substrate; and a controller electrically connected to the semiconductor device on the main substrate. The semiconductor device includes: a semiconductor substrate having a first surface and a second surface opposing each other; a back side insulating layer below the second surface of the semiconductor substrate; an external input/output conductive pattern below the back side insulating layer; a circuit device including a gate electrode and a source/drain region, on the first surface of the semiconductor substrate; an internal input/output conductive pattern on the first surface of the semiconductor substrate, the internal input/output conductive pattern having at least a portion disposed on the same level as at least a portion of the gate electrode; a through-electrode structure penetrating through the semiconductor substrate and the back side insulating layer and electrically connected to the internal input/output conductive pattern and the external input/output conductive pattern; and a memory cell array region disposed on a level higher than the circuit device, on the first surface of the semiconductor substrate.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Throughout the present disclosure, directional terms such as "upper," "upper portion," "upper surface," "lower," "lower portion," "lower surface," "side surface," and the like, may be relative terms based on the drawings, unless specifically stated otherwise.

Figure 1:
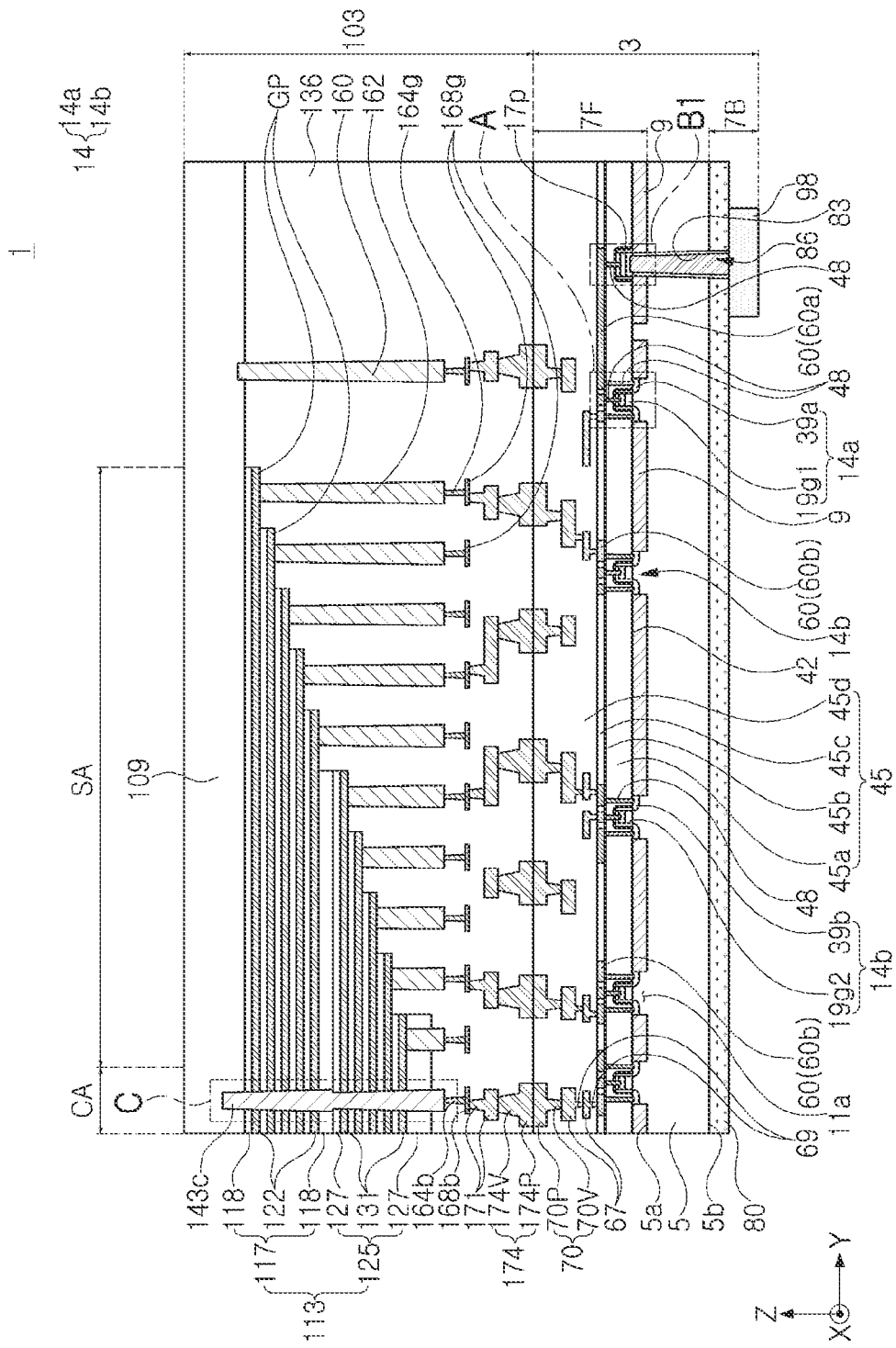
FIG. 1 is a schematic cross-sectional view of a semiconductor device according to an example embodiment.

Hereinafter, a semiconductor device according to an example embodiment will be described with reference to FIGS. 1 and 2A. FIG. 1 is a schematic cross-sectional view of a semiconductor device according to an example embodiment, and FIG. 2A is a partially enlarged cross-sectional view of region 'A' and region 'B1' of FIG. 1.

Figure 2A:
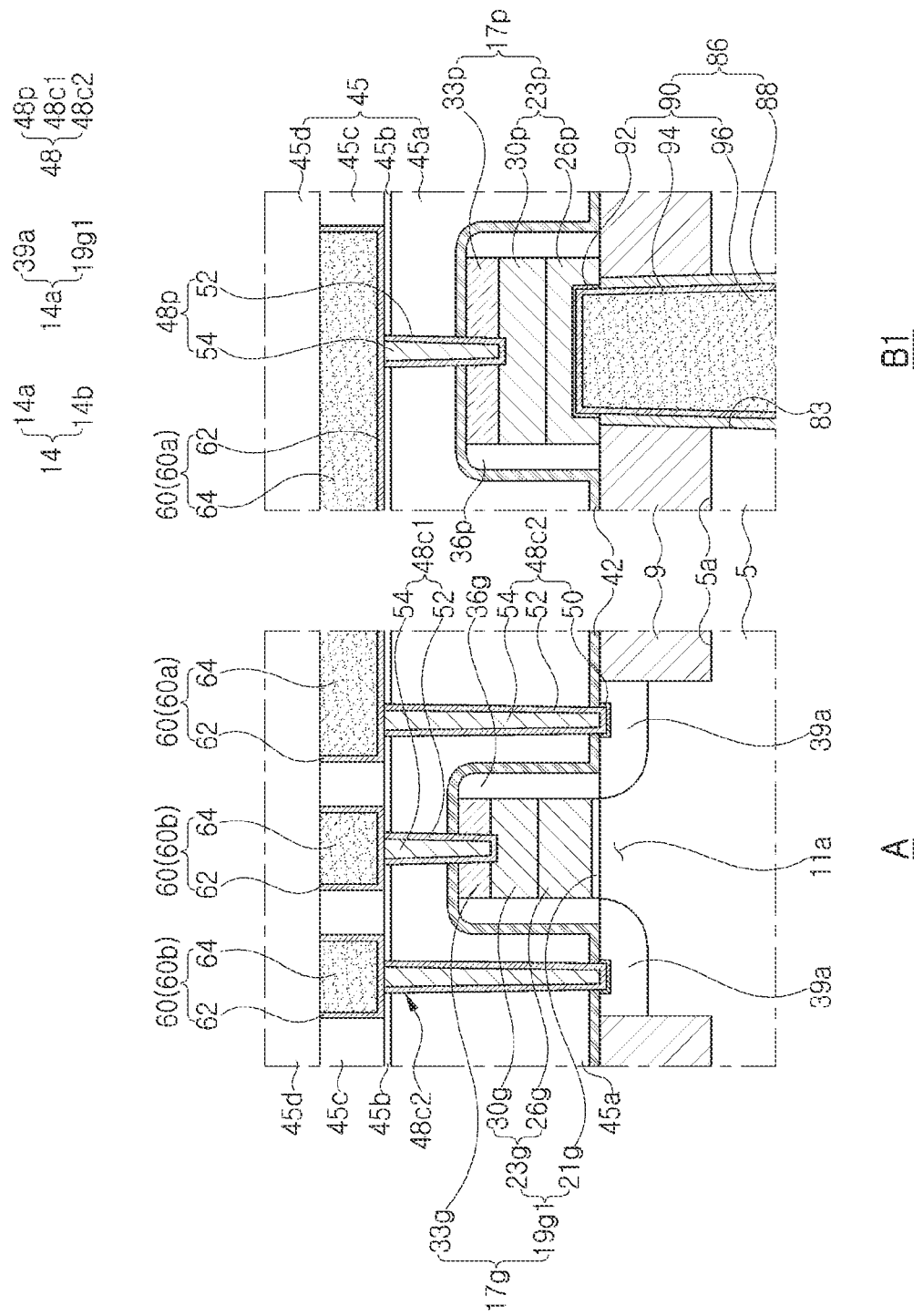
FIGS. 2A and 2B are enlarged cross-sectional views of portions of FIG. 1.

Referring to FIGS. 1 and 2A, a semiconductor device 1 according to an example embodiment may include a first structure 3 and a second structure 103 on the first structure 3.

The first structure 3 may include a peripheral circuit 14, and the second structure 103 may include a memory cell array CA, in which memory cells capable of storing data are three-dimensionally arranged, and a staircase region SA adjacent to the memory cell array region CA.

The first structure 3 may be referred to as a first semiconductor chip, a logic chip or a first chip structure, and the second structure 103 may be referred to as a second semiconductor chip, a memory chip or a second chip structure.

In an example embodiment, the first structure 3 may include a semiconductor substrate 5 having a first surface 5a and a second surface 5b opposing each other, a front side structure 7F on the first surface 5a of the semiconductor substrate 5, a back side structure 7B below the second surface 5b of the semiconductor substrate 5, and a through-electrode structure 86 including at least a portion penetrating through the semiconductor substrate 5.

In an exemplary example, the front side structure 7F may include a device isolation layer 9 on the first surface 5a of the semiconductor substrate 5 and active regions 11a defined by the device isolation layer 9. The front side structure 7F may include the peripheral circuit 14. Among peripheral circuits 14, some peripheral circuits 14 may be MOS transistors. For example, the peripheral circuit 14 may include a first circuit device 14a and a second circuit device 14b. The first circuit device 14a may include a first gate structure 19g1 and first source/drain regions 39a, and the second circuit device 14b may include a second gate structure 19g2 and second source/drain regions 39b.

In embodiments, the first circuit device 14a may be an input/output circuit device, and the second circuit device 14b may be a peripheral circuit device.

At least a portion of the first gate structure 19g1 may be disposed on one of the active regions 11a, and the first source/drain regions 39a may be disposed in the circuit active region 11a on opposite sides adjacent to the first gate structure 19g1. The first gate structure 19g1 may include a gate dielectric layer 21g and a gate electrode 23g stacked in order on the circuit active region 11a.

In an example embodiment, the front side structure 7F may further include an internal input/output conductive pattern 23p having a portion disposed on the same height level as at least a portion of the gate electrode 23g.

In an example embodiment, each of the gate electrode 23g and the internal input/output conductive pattern 23p may include lower conductive patterns 26g and 26p and upper conductive patterns 30g and 30p including one or more layers on the lower conductive patterns 26g and 26p. The lower conductive patterns 26g and 26p may include a silicon layer, for example, a doped silicon layer, and the upper conductive patterns 30g and 30p may be formed of at least one of a metal nitride (for example, titanium nitride (TiN), or the like), a metal (for example, tungsten (W), or the like), a metal-semiconductor compound (for example, tungsten silicide (WSi), or the like), or a combination of two or more thereof. For example, each of the gate electrode 23g and the internal input/output conductive pattern 23p may be formed of doped silicon and a metal-semiconductor compound disposed on the doped silicon to be in contact with the doped silicon layer.

Hereinafter, the lower conductive pattern 26g of the gate electrode 23g will be referred to as a lower gate pattern 26g, the upper conductive pattern 30g of the gate electrode 23g will be referred to as an upper gate pattern 30g, the lower conductive pattern 26p of the internal input/output conductive pattern 23p will be referred to as a lower pad pattern 26p, and the upper conductive pattern 30p of the internal input/output conductive pattern 23p will be referred to as an upper pad pattern 30p.

The lower gate pattern 26g and the lower pad pattern 26p may be formed of the same material, and the upper gate pattern 30g and the lower pad pattern 30p may be formed of the same material.

In an example embodiment, the lower gate pattern 26g and the lower pad pattern 26p may have the same thickness. The upper gate pattern 30g and the upper pad pattern 30p may have the same thickness.

In an example embodiment, the front side structure 7F may further include a gate capping pattern 33g on each of the first and second gate structures 19g1 and 19g2 and a pad capping a pattern 33p on the internal input/output conductive pattern 23p. The gate capping pattern 33g and the pad capping pattern 33p may be formed of the same insulating material. For example, the gate capping pattern 33g and the pad capping pattern 33p may include at least one of a silicon oxide layer, a silicon nitride layer, or a silicon oxynitride layer.

The first and second gate structures 19g1 and 19g2 and the gate capping patterns 33g, stacked in order, may constitute the gate stacking patterns 17g. The internal input/output conductive pattern 23p and the pad capping pattern 33p, stacked in order, may constitute a pad stack pattern 17p.

In an example embodiment, the front side structure 7F may further include a gate spacer 36g on a side surface of the gate stack pattern 17g and a pad spacer 36p on a side surface of the pad stack pattern 17p. The gate spacer 36g and the pad spacer 36p may be formed of the same insulating material. For example, the gate spacer 36g and the pad spacer 36p may include at least one of a silicon oxide layer, a silicon nitride layer, or a silicon oxynitride layer.

In an example embodiment, the front side structure 7F may further include an insulating liner 42 covering the device isolation layer 9, the gate stack patterns 17g, and the pad stack pattern 17p, the gate spacer 36g, and the pad spacer 36p on the first surface 5a of the semiconductor substrate 5. The insulating liner 42 may be formed of a material different from a silicon oxide, for example, a silicon nitride.

In an example embodiment, the front side structure 7F may further include a first insulating structure 45 disposed on the insulating liner 42.

In an example embodiment, the first insulating structure 45 may include a first insulating layer 45a, a second insulating layer 45b, a third insulating layer 45c, and a fourth insulating layer 45d stacked in order.

The second insulating layer 45b may be formed of a material different from that of the first insulating layer 45a and the third insulating layer 45c. For example, the first insulating layer 45a and the third insulating layer 45c may be formed of a silicon oxide or a low-k dielectric, and the second insulating layer 45b may be formed of a silicon nitride or a high-k dielectric.

In an example embodiment, the second insulating layer 45b may be formed to have a multilayer structure. For example, the second insulating layer 45b may include high-k dielectric layers having different dielectric constants and stacked in order.

In an example embodiment, the front side structure 7F may further include contact plugs 48 penetrating through a portion of the first insulating structure 45. For example, the contact plugs 48 may penetrate through the first and second insulating layers 45a and 45b of the first insulating structure 45. The contact plugs 48 may have upper surfaces coplanar with each other.

In an example embodiment, the contact plugs 48 may include an input/output connection contact plug 48p disposed to be in contact with and electrically connected to the internal input/output conductive pattern 23p, first contact plugs 48c1 disposed to be in contact with and electrically connected to the first and second gate structures 19g1 and 19g2 of the peripheral circuit 14, and second contact plugs 48c2 disposed to be respectively in contact with and electrically connected to the first and second source/drain regions 39a and 39b of the peripheral circuit 14.

In an example embodiment, the input/output connection contact plug 48p may overlap the through-electrode structure 86 in a vertical direction Z.

In an example embodiment, the input/output connection contact plug 48p may extend inwardly of internal input/output conductive pattern 23p while being in contact with the internal input/output conductive pattern 23p. Accordingly, a lower surface of the input/output connection contact plug 48p may be disposed on a lower level than an upper surface of the internal input/output conductive pattern 23p.

In an example embodiment, the input/output connection contact plug 48p may be in contact with the upper pad pattern 30p and may be spaced apart from the lower pad pattern 26p.

Each of the input/output connection contact plug 48p, the first contact plugs 48c1, and the second contact plugs 48c2 may include a plug pattern 54 and a barrier layer 52 covering a side surface and a bottom surface of the plug pattern 54. Each of the second contact plugs 48c2 may further include a metal-semiconductor compound layer 50 between the barrier layer 52 and each of the first and second source/drain regions 39a and 39b. The plug pattern 54 may include a metal material such as tungsten. As an example, the barrier layer 52 may have a multilayer structure including a metal layer such as a titanium (Ti) layer and a metal nitride layer such as a titanium nitride (TiN) layer. As another example, the barrier layer 52 may be formed of a metal nitride such as TiN. The metal-semiconductor compound layer 50 may be formed of a metal silicide such as titanium silicide (TiSi), cobalt silicide (CoSi), or nickel silicide (NiSi), but embodiments are not limited to such materials.

In an example embodiment, the front side structure 7F may further include lower interconnections 60 electrically connected to the contact plugs 48. As an example, the lower interconnections 60 may be electrically connected to the contact plugs 48 on the second insulating layer 45b. As another example, the lower interconnections 60 may be electrically connected to the contact plugs 48 while being in contact with the first insulating layer 45a and the contact plugs 48.

As an example, the third insulating layer 45c may be disposed on side surfaces of the lower interconnections 60.

Each of the lower interconnections 60 may further include a wiring pattern 64 and a barrier layer 62 covering a lower surface of the wiring pattern 64. The barrier layer 62 may include a metal nitride (for example, a titanium nitride (TiN), or the like). The wiring pattern 64 may include a metal (for example, copper (Cu), tungsten (W), or the like). As an example, the barrier layer 62 may extend upwardly of a side surface of the wiring pattern 64 from a portion covering a lower surface of the wiring pattern 64 to cover the side surface of the wiring pattern 64.

The lower interconnections 60 may include input/output connection wirings 60a and circuit wirings 60b.

As an example, the input/output connection wiring 60a may be in contact with one of the first and second contact plugs 48c1 and 48c2, electrically connected to the first circuit device 14a, for example, the second contact plug 48c2, and may electrically connect the second contact plug 48c2 and the input/output connection contact plug 48p to each other. As an example, among the first and second contact plugs 48c1 and 48c2 electrically connected to the first circuit device 14a, the second contact plug 48c2 may be electrically connected to one of the first/source drain regions 39a. Accordingly, the input/output connection wiring 60a may electrically connect the first circuit device 14a and the internal input/output conductive pattern 23p to each other.

The input/output connection contact plug 48p may electrically connect the input/output connecting wiring 60a and the internal input/output conductive pattern 23p to each other between a portion of the input/output connection wiring 60a, overlapping the internal input/output conductive pattern 23p, and the internal input/output conductive pattern 23p. One circuit contact plug, for example, the second contact plug 48c2 may electrically connect a portion of the input/output connecting wiring 60a, overlapping the first circuit device 14a, and the first circuit device 14a to each other.

As an example, the circuit wirings 60b may be electrically connected to contact plugs 48, not electrically connected to the input/output connection wiring 60a, among the contact plugs 48. Accordingly, the circuit wirings 60b may be electrically connected to the peripheral circuit 14 through the contact plugs 48.

In an example embodiment, the front side structure 7F may further include a plurality of upper interconnections 67, disposed on different height levels, and a plurality of wiring vias 69, respectively disposed below the plurality of upper interconnections 67, on the lower interconnections 60.

In embodiments, the term "wiring" may refer to a line-shaped wiring or an interconnection line. Therefore, each of the lower interconnections 60 and the upper interconnections 67 may be a line-shaped wiring. Among the line-shaped wirings disposed on a level higher than the gate electrode 23g, the lower interconnections 60 may be disposed in a lowermost portion. Among the line-shaped wirings, the lower interconnections 60 disposed in the lowermost portion may include the input/output connection wiring 60a and the circuit wirings 60b.

The plurality of upper interconnections 67 and the plurality of wiring vias 69 may be electrically connected to the circuit wirings 60b. The plurality of upper interconnections 67 and the plurality of wiring vias 69 may be disposed in the fourth insulating layer 45d.

First bonding patterns 70 may be disposed on uppermost upper interconnections, among the plurality of upper interconnections 67. Each of the first bonding patterns 70 may include a first bonding pad 70P and a first bonding via 70V below the first bonding pad 70P. As an example, the first bonding patterns 70 may include a copper material.

Upper surfaces of the first bonding patterns 70 and an upper surface of the fourth insulating layer 45d may be coplanar with each other.

In an example embodiment, the back side structure 7B may include a back side insulating layer 80, covering the second surface 5b of the semiconductor substrate 5, and an external input/output conductive pattern 98 below the back side insulating layer 80. As an example, the external input/output conductive pattern 98 may include a conductive material such as aluminum. However, embodiments are not limited thereto, and the external input/output conductive pattern 98 may include a material, other than aluminum, for example, copper. As an example, the back side insulating layer 80 may include an insulating material such as a silicon oxide, a silicon nitride, or a polyimide.

In an example embodiment, at least a portion of the through-electrode structure 86 may be disposed in a through-hole 83 penetrating through the back side insulating layer 80, the semiconductor substrate 5, and the device isolation layer 9.

In an example embodiment, the through-electrode structure 86 may be electrically connected to the internal input/output conductive pattern 23p and the external input/output conductive pattern 98. For example, the through-electrode structure 86 may extend downwardly from a portion, penetrating through the semiconductor substrate 5, to be in contact with the external input/output conductive pattern 98 through the back side insulating layer 80, and may extend upwardly from the portion, penetrating through the semiconductor substrate 5, to be in contact with the internal input/output conductive pattern 23p through the device isolation layer 9. Accordingly, the through-electrode structure 86 may penetrate through the back side insulating layer 80, the semiconductor substrate 5, and the device isolation layer 9.

The through-electrode structure 86 may include a through-electrode 90 and an insulating spacer 88 surrounding a side surface of the through-electrode 90. The insulating spacer 88 may include an insulating material such as a silicon oxide or a silicon nitride.

In an example embodiment, the through-electrode 90 includes an electrode pattern 96, a barrier layer 94 covering a side surface and an upper surface of the electrode pattern 96, and a metal-semiconductor compound layer 92 between the barrier layer 94 and the internal input/output conductive patterns 23p. The electrode pattern 96 may include a metal material such as tungsten, aluminum, or copper. As an example, the barrier layer 94 may have a multilayer structure including a metal layer, such as a titanium (Ti) layer, and a metal nitride layer such as a titanium nitride (TiN) layer, a tantalum nitride (TaN) layer, or a tungsten nitride (WN) layer. As another example, the barrier layer 94 may be formed of a metal nitride such as TiN, TaN, or WN. The metal-semiconductor compound layer 92 may be formed of a metal silicide such as titanium silicide (TiSi), tantalum silicide (TaSi), tungsten silicide (WSi), cobalt silicide (CoSi), or nickel silicide (NiSi), but embodiments are not limited to such materials. In an example embodiment, the through-electrode 90 may have a lower surface and an upper surface having a smaller width than the lower surface. The lower surface of the through-electrode 90 may be in contact with the external input/output conductive pattern 98, and the upper surface of the through-electrode 90 may be in contact with the internal input/output conductive pattern 23p.

In an example embodiment, the through-electrode 90 may extend inwardly of the internal input/output conductive pattern 23p while being in contact with the internal input/output conductive pattern 23p. Accordingly, the upper surface of the through-electrode 90 may be disposed on a level higher than the lower surface of the internal input/output conductive pattern 23p.

In an example embodiment, the through-electrode 90 may be in contact with the lower pad pattern 26p and may be spaced apart from the upper pad pattern 30p.

In an example embodiment, an upper end of the through-electrode 90 may be disposed on a level higher than an upper end of the insulating spacer 88.

In an example embodiment, the second structure 103 may include a pattern structure 109, a stack structure 113, vertical memory structures 143c, a second insulating structure 136, and the second bonding patterns 174. Each of the second bonding patterns 174 may include a second bonding pad 174P and a second bonding via 174V on the second bonding pad 174P.

In an embodiment, the stack structure 113 may be disposed in the memory cell array region CA and the staircase region SA, and the vertical memory structures 143c may be disposed in the memory cell array region CA. Accordingly, the memory cell array region CA may be described as including a certain region of the stack structure 113 and the vertical memory structures 143c, and the staircase region SA may be described as including the other regions of the stack structure 113 adjacent to memory cell array region CA.

The pattern structure 109 may include a doped silicon layer. For example, the pattern structure 109 may include a polysilicon layer having an N-type conductivity type.

The stack structure 113 may be disposed between the pattern structure 109 and the first structure 3.

In an example embodiment, the stack structure 113 may include interlayer insulating layers 118 and 127 and gate layers 122 and 131 stacked alternately and repeatedly in the vertical direction Z. Each of the gate layers 122 and 131 may include a conductive layer. The gate layers 122 and 131 may be stacked while being spaced apart from each other in the vertical direction Z.

In an example embodiment, at least some of the gate layers 122 and 131 may be wordlines. Among the gate layers 122 and 131, one or more upper gate layers disposed on and/or one or more upper gate layers disposed below may be select gate electrodes, and a plurality of gate layers disposed between the one or more upper gate layers and the one or more upper gate layers may be wordlines.

In an example embodiment, the stack structure 113 may include a first stack region 125 and a second stack region 117 on the first stack region 125. The first stack region 125 may be disposed between the second stack region 117 and the first structure 3.

In an example embodiment, the first stack region 125 may include first interlayer insulating layers 127 and first gate layers 131 that are alternately and repeatedly stacked. Among the first interlayer insulating layers 127 and the first gate layers 131, each of an uppermost layer and a lowermost layer may be the first interlayer insulating layer.

In an example embodiment, the second stack region 117 may include second interlayer insulating layers 118 and second gate layers 122 stacked alternately and repeatedly. Among the second interlayer insulating layers 118 and the second gate layers 122, each of a lowermost layer and an uppermost layer may be the second interlayer insulating layer.

In the staircase region SA, the first and second gate layers 131 and 122 may have pad regions GP arranged in a staircase shape. The pad regions GP of the first and second gate layers 131 and 122 may have a staircase shape lowered in a direction toward the pattern structure 109 from the first structure 3.

The second structure 103 may further include gate contact plugs 162 disposed to be in contact with the pad regions GP and to be electrically connected to the first and second gate layers 131 and 122. For example, the gate contact plugs 162 may be electrically connected to first and second gate layers 131 and 122, which may be select gate electrodes and wordlines, among the first and second gate layers 131 and 122. The gate contact plugs 162 may extend downwardly from portions of the first and second gate layers 131 and 122 in contact with the pad regions GP. The second structure 103 may further include a source contact plug 160 disposed to be in contact with the pattern structure 109 and to be electrically connected to the pattern structure 109 and extending downwardly from a portion in contact with the pattern structure 109. The gate contact plugs 162 and the source contact plug 160 may be formed of the same conductive material.

The vertical memory structures 143c may penetrate through the stack structure 113 in the memory cell array region CA. For example, the vertical memory structures 143c may penetrate through the gate layers 122 and 131, which may be select gate electrodes and wordlines, in the vertical direction Z.

In an example, the vertical memory structures 143c may extend inwardly of the pattern structure 109 from a portion, penetrating through the stack structure 113, to be in contact with the pattern structure 109.

The second bonding patterns 174 may be bonded to the first bonding patterns 70 while being in contact with the first bonding patterns 70. For example, the first bonding pads 70P of the first bonding patterns 70 may contact the second bonding pads 174P of the second bonding patterns 174. The first and second bonding patterns 70 and 174 may include the same conductive material, for example, copper. For example, a copper material of the first bonding patterns 70 and a copper material of the second bonding patterns 174 may be bonded to each other while being in contact with each other. The fourth insulating layer 45d of the first insulating structure 45 and the second insulating structure 136 may be bonded to each other while being in contact with each other.

In an example embodiment, the second insulating structure 136 may surround side surfaces of the second bonding patterns 174 and may cover the stack structure 113, on the first structure 3.

The second structure 103 may further include bitlines 168b, gate connection wirings 168g, and bitline connection vias 164b, and gate connection vias 164g between the stack structure 113 and the first structure 3. The bitline connection vias 164b may electrically connect the bitlines 168b and the vertical memory structures 143c to each other between the bitlines 168b and the vertical memory structures 143c. The gate connection vias 164g may electrically connect the gate connection wires 168g and the gate contact plugs 162 to each other between the gate connection wires 168g and the gate contact plugs 162.

The second structure 103 may further include an interconnection structure 171 electrically connecting the bitlines 168b and the gate connection wirings 168g to the second bonding patterns 174.

In embodiments, the first structure 3 including the peripheral circuit 14 and the second structure 103 including the memory cell array region CA may be bonded to each other while being in contact with each other through bonding between the first and second bonding patterns 70 and 174 and bonding between the first and second insulating structures 45 and 136. Accordingly, since the semiconductor device 1 according to an example embodiment may include the first structure 3 and the second structure 103 bonded to each other while being in contact with each other in the vertical direction Z, the integration density of the semiconductor device 1 may be increased In embodiments, the semiconductor device 1, including the peripheral circuit 14, may communicate with or be electrically connected to another semiconductor device outside the semiconductor device 1 or a controller through the external input/output conductive pattern 98 below the semiconductor substrate 5. Accordingly, since an electrical path between the peripheral circuit 14 and the external input/output conductive pattern 98 may be significantly shortened, performance of the semiconductor device 1 may be improved and reliability of the semiconductor device 1 may be improved.

In embodiments, to further shorten an electrical path between the peripheral circuit 14 and the external input/output conductive pattern 98, the semiconductor device 1 may electrically connect the first circuit device of the peripheral circuit 14, for example, the input/output circuit device 14a and the external input/output conductive pattern 98 to each other through the input/output connection wiring 60a, disposed in a lowermost portion, among line-shaped wirings disposed on a level higher than the gate electrode 23g. Accordingly, the performance of the semiconductor device 1 may be further improved and the reliability of the semiconductor device 1 may be further improved.

Figure 2B:
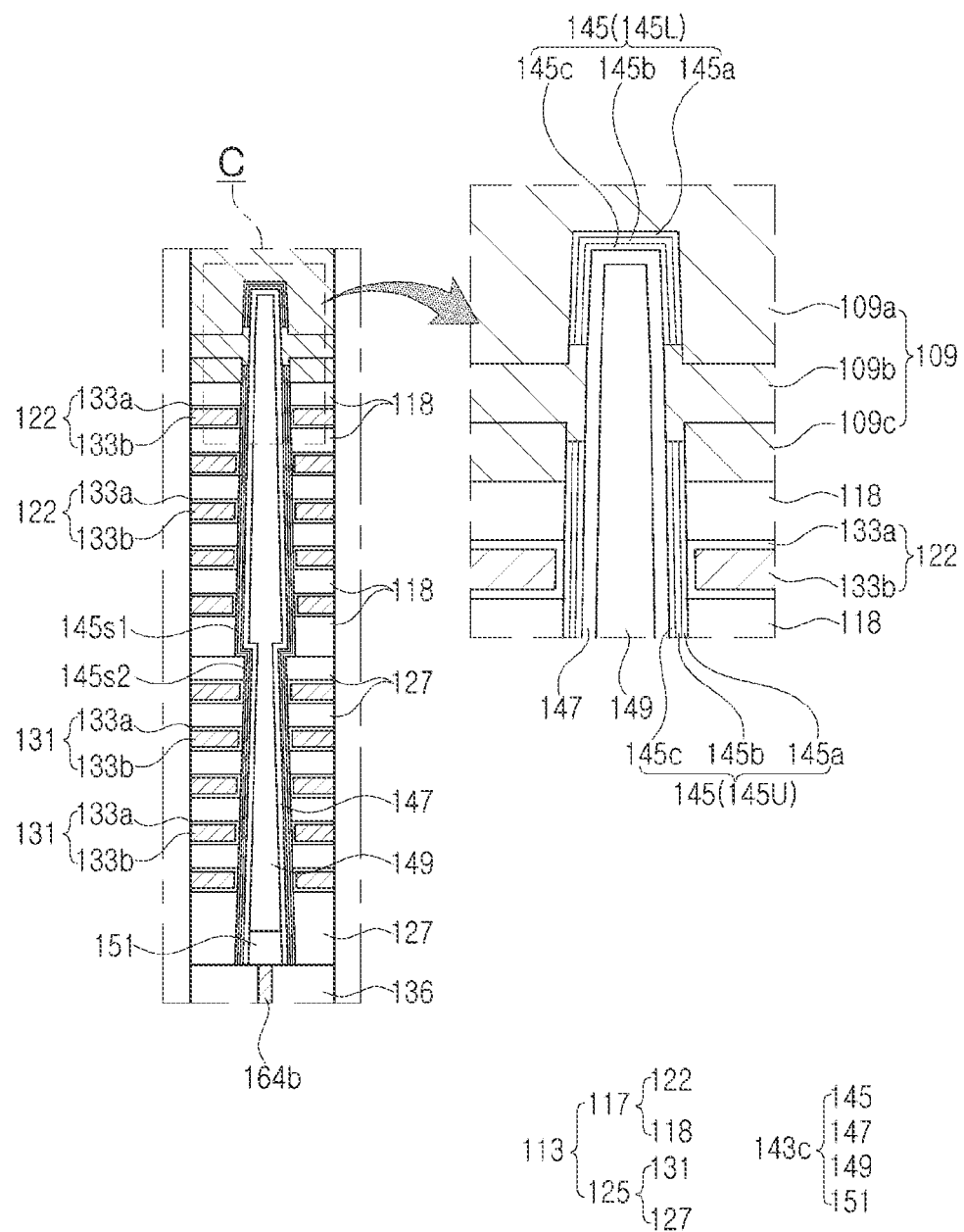

Next, an example embodiment of the vertical memory structure 143c, the stack structure 113, and the pattern structure 109 will be described with reference to FIG. 2B together with FIG. 1. FIG. 2B is a partially enlarged cross-sectional view of an enlarged region denoted by "C" of FIG. 1.

Referring to FIGS. 1 and 2B, in an example embodiment, the pattern structure 109 may include a plurality of layers. For example, the pattern structure 109 may include a first pattern layer 109a, a second pattern layer 109b below the first pattern layer 109a, and a third pattern layer 109c below the second pattern layer 109b. At least one of the first pattern layer 109a, the second pattern layer 109b, and the third pattern layer 109c may include a polysilicon layer. For example, each of the first pattern layer 109a, the second pattern layer 109b, and the third pattern layer 109c may include a polysilicon layer. At least one of the first pattern layer 109a, the second pattern layer 109b, and the third pattern layer 109c may include an N-type polysilicon layer.

The vertical memory structure 143c may penetrate through the stack structure 113, and may extend inwardly of the pattern structure 109.

The vertical memory structure 143c may include a core region 149, a channel layer 147, a pad pattern 151, and a data storage structure 145. The channel layer 147 may cover a side surface and a bottom surface of the core region 149. The channel layer 147 may be formed of a semiconductor material such as silicon. For example, the channel layer 147 may be formed of polysilicon. The core region 149 may be formed of a silicon oxide or a silicon oxide having voids or seams therein. The pad pattern 151 may be disposed on the core region 149, and may be in contact with the channel layer 147. The pad pattern 151 may be formed of N-type polysilicon.

In an example embodiment, the data storage structure 145 may cover an external side surface of the channel layer 147 to cover an upper surface of the channel layer 147. The upper surface of the channel layer 147 may be an upper surface of the channel layer 147 when viewed in FIG. 2B.

In an example embodiment, the second pattern layer 109b may penetrate through the data storage structure 145 and may be in contact with the channel layer 147, and the first and third pattern layers 109a and 109c may be spaced apart from the channel layer 147 by the data storage structure 145. The data storage structure 145 may be separated by the second pattern layer 109b to include a first data storage structure 145U, disposed below, and a second data storage structure 145L disposed on.

The data storage structure 145 may include a first dielectric layer 145a, a second dielectric layer 145c, and a data storage layer 145b between the first dielectric layer 145a and the second dielectric layer 145c. At least one of the first and second dielectric layers 145a and 145c may include a silicon oxide and/or a high-k dielectric.

In an example embodiment, the data storage layer 145b may include a material capable of trapping charges, for example, a silicon nitride.

In an example embodiment, in a semiconductor device such as a NAND flash memory device, the data storage layer 145b may include regions capable of storing data. For example, the data storage layer 145b may include data storage regions capable of storing data between gate layers, which may be wordlines among the gate layers 122 and 131, and the channel layer 147. Such data storage regions may constitute memory cells capable of storing data, and may be arranged in a substantially vertical direction in a single vertical memory structure 143c, and a vertical memory structure including such data storage regions may include a plurality of vertical memory structures 143c arranged in a horizontal direction. Accordingly, the vertical memory structure 143c including a plurality of data storage regions, capable of constituting memory cells, may include a plurality of vertical memory structures 143c. As a result, the semiconductor device 1 according to an example embodiment may include a memory cell array region CA including three-dimensionally arranged memory cells.

In another example, the vertical memory structure 143c may include data storage regions of a memory device storing data using a change in resistance. For example, the vertical memory structure 143c may include a data storage structure of a ReRAM including one of SiOx, AlOx, MgOx, ZrOx, HfOx, SiNx, WOx, and TiOx, or a composite material including at least two thereof. Alternatively, the vertical memory structure 143c may include a data storage structure of a phase change random access memory (PRAM) including a phase change memory material such as a chalcogenide material including germanium (Ge), antimony (Sb), and/or tellurium (Te).

In embodiments, the vertical memory structure 143c may be referred to as a term such as a vertical structure, a vertical pattern, or a channel structure.

Each of the gate layers 122 and 131 may include a first layer 133a and a second layer 133b. The first layer 133a may extend between side surfaces of the vertical memory structure 143c and the second layer 133b while covering upper and lower surfaces of the second layer 133b.

In an example embodiment, the first layer 133a may include a dielectric material, and the second layer 133b may include a conductive material. As an example, the first layer 133a may include a high-k dielectric such as an aluminum oxide (AlO), and the second layer 133b includes a conductive material such as titanium nitride (TiN), tungsten nitride (WN), titanium (Ti), or tungsten (W).

As another example, the first layer 133a may include a first conductive material (for example, TiN, W, or the like), and the second layer 133b is a second conductive material (Ti, W, or the like) different from the first conductive material.

As another example, each of the gate layers 122 and 131 may be formed of doped polysilicon, a metal-semiconductor compound (for example, TiSi, TaSi, CoSi, NiSi, or WSi), a metal nitride (for example, TiN, TaN, or WN), or a metal (for example, Ti or W).

As described on, the stack structure 113 may include the first stack region 125 and the second stack region 117.

The vertical memory structure 143c may include a lower vertical portion 145s2, penetrating through the first stack region 125, and an upper vertical portion 145s1 penetrating through the second stack region 117.

In an example embodiment, a side surface of the lower vertical portion 145s2 and a side surface of the upper vertical portion 145s1, adjacent to each other, may not be aligned in the vertical direction. Accordingly, the side surface of the vertical memory structure 143c may have a curved portion in a boundary region between the first horizontal conductive layers 131 of the first stack region 125 and the second horizontal conductive layers 122 of the second stack region 117.

In an example embodiment, in the vertical memory structure 143c, a width of the upper vertical portion 145s1, adjacent to the lower vertical portion 145s2, may be greater than a width of the lower vertical portion 145s2 adjacent to the upper vertical portion 145s1.

Figure 3:
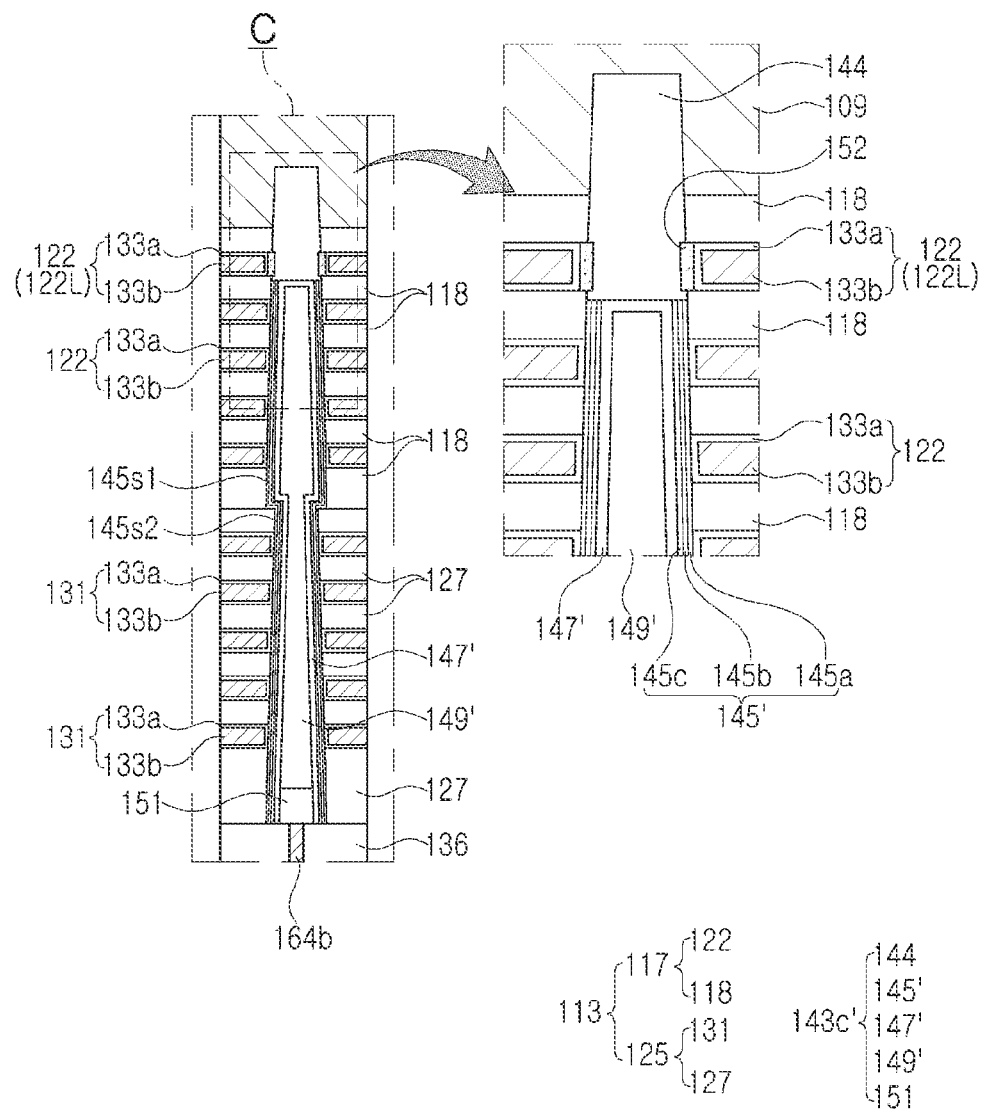
FIG. 3 is a partially enlarged cross-sectional view illustrating a modified example of a semiconductor device according to an example embodiment.

Next, a modified example of the vertical memory structure 143c will be described with reference to FIG. 3. FIG. 3 is a partially enlarged view corresponding to the partially enlarged view of FIG. 2B. Hereinafter, in the vertical memory structure 143c described with reference to FIG. 2A, modified portions will be intensively described.

Referring to FIG. 3, a vertical memory structure 143c', penetrating through the stack structure 113 and extending inwardly of the pattern structure 109, may include an epitaxial channel layer 144 including a portion disposed within the pattern structure 109 and having an upper surface disposed on a lower level than a lower surface of at least a lowermost gate layer 122L, among the layers 122 and 131, and disposed on a level higher than an upper surface of the lowermost gate layer, a core region 149' disposed below the epitaxial channel layer 144, a channel layer 147' interposed between the core region 149' and the epitaxial channel layer 144 and covering a side surface of the core region 149', and a data storage structure 145' covering an external side surface of the channel layer 147'. The data storage structure 145' may include a first dielectric layer 145a, a second dielectric layer 145c, and a data storage layer 145b between the first and second dielectric layers 145a and 145c.

In an example embodiment, a dielectric layer 152 may be disposed between the lowermost gate layer 122L and the epitaxial channel layer 144.

Figure 4:
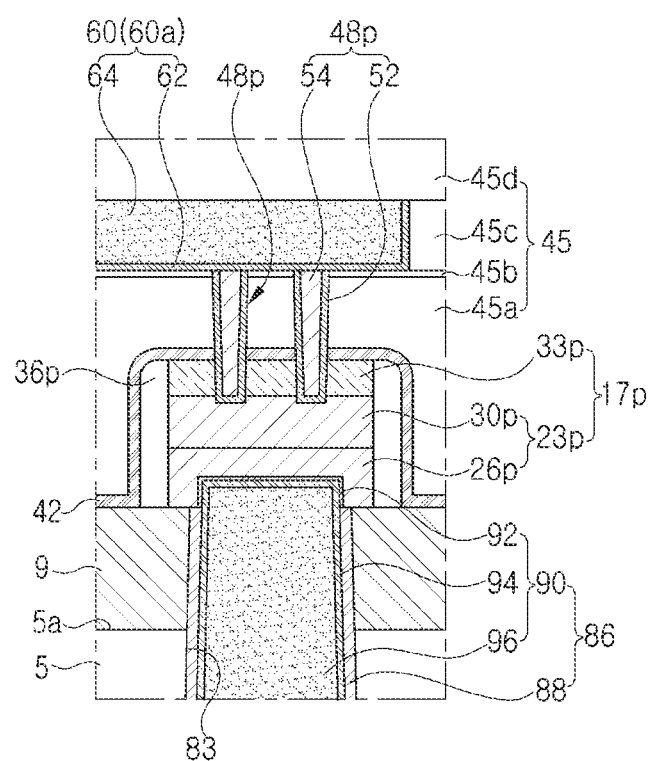
FIGS. 4 to 8 are partially enlarged cross-sectional views illustrating modified examples of a semiconductor device according to an example embodiment, respectively.

Next, a modified example of the region denoted by "B1" of FIG. 2A will be described with reference to FIG. 4. FIG. 4 is a partially enlarged cross-sectional view corresponding to the area denoted by "B1" of FIG. 2A, and may illustrate a modified example of the input/output connection contact plug 48p described in FIG. 2A.

In a modified example, only one input/output connection contact plug 48p in contact with the internal input/output conductive pattern 23p is illustrated in FIGS. 1 and 2A of the on-described embodiment, but the present disclosure is not limited thereto. As illustrated in FIG. 4, a plurality of input/output connection contact plugs 48p may be disposed. For example, as illustrated in FIG. 4, the plurality of input/output connection contact plugs 48p may be in contact with the internal input/output conductive pattern 23p.

In an example embodiment, at least some of the plurality of input/output connection contact plugs 48p may overlap the through-electrode structure 86.

In embodiments, the input/output connection contact plug 48p may be provided with a single input/output connection contact plug 48p or a plurality of input/output connection contact plugs 48p. In various modified examples described below, although a plurality of input/output connection contact plugs 48p are illustrated, a single input/output connection contact plug 48p may be considered to be provided.

Next, various modified examples of the region denoted by "B1" of FIG. 2A will be described with reference to FIGS. 4 and 5A to 5E, respectively. FIG. 4 is a partially enlarged cross-sectional view corresponding to the region denoted by "'B1" of FIG. 2A, and may illustrate a modified example of the input/output connection contact plug 48p described in FIG. 2A, and FIGS. 5A to 5E are partially enlarged cross-sectional views corresponding to the region denoted by "B1", and may illustrate various modified examples of the through-electrode structure 86 described in FIG. 2A. Hereinafter, when various modified examples of the through-electrode structure 86 described in FIG. 2A are described with reference to FIGS. 5A to 5E, respectively, contents able to be easily understood from the descriptions will be omitted and elements, other than the through-electrode structure 86, will be described through direct citations without additional descriptions. In a modified example, referring to FIG. 5A, a through-electrode structure 86a may include a through-electrode 90a, penetrating through the back side insulating layer 80, the semiconductor substrate 5, and the device isolation layer 9 and extending inwardly of the internal input/output conductive pattern 23p, and an insulating spacer 88a surrounding a portion of a side surface of the through-electrode 90a.

In a portion of the through-electrode 90a extending inwardly of the internal input/output conductive pattern 23p, the through-electrode 90a may have a portion penetrating through the lower pad pattern 26p and in contact with the upper pad pattern 30p. The through-electrode 90a may further include a portion extending inwardly of the upper pad pattern 30p. Accordingly, an upper surface of the through-electrode 90a may be disposed on a level higher than a lower surface of the upper pad pattern 30p. The insulating spacer 88a may be in contact with the lower pad pattern 26p and may be spaced apart from the upper pad pattern 30p.

The through-electrode 90a may include an electrode pattern 96a and a barrier layer 94a, respectively corresponding to the electrode pattern (96 of FIG. 2A) and the barrier layer (94 of FIG. 2A) described in FIG. 2A. The barrier layer 94a of the through-electrode 90a may be in contact with the upper pad pattern 30p.

Figure 5A:
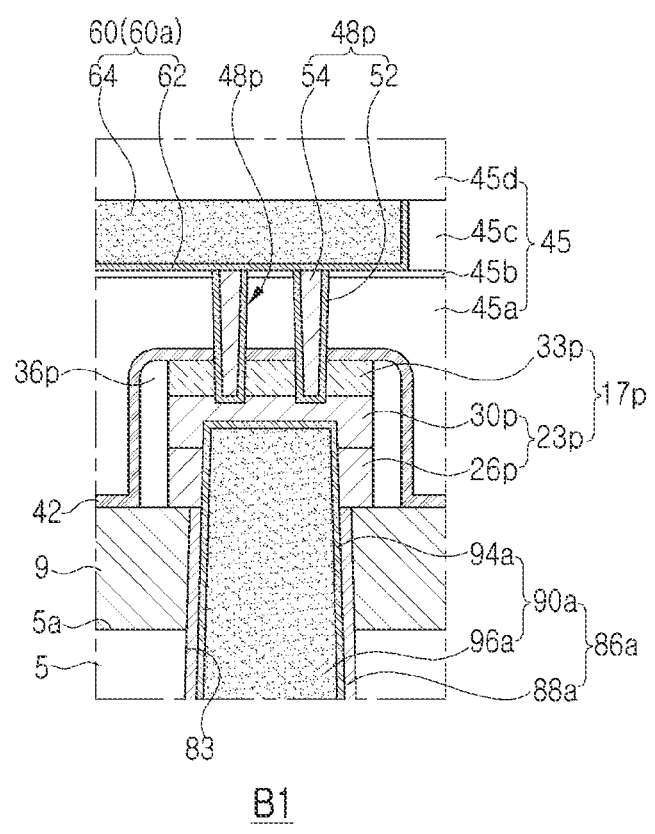
Figure 5B:
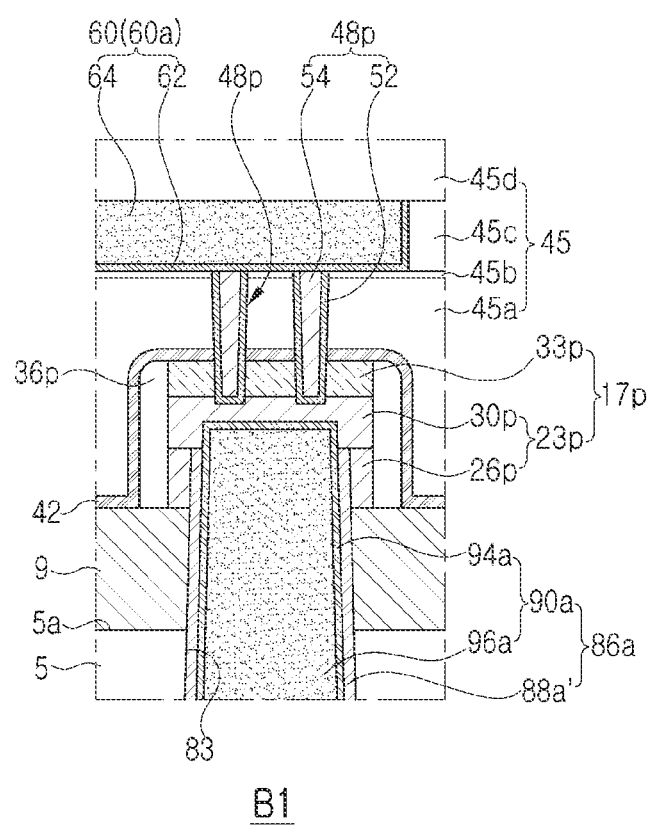

In a modified example, referring to FIG. 5B, the insulating spacer 88a described in FIG. 5A may be replaced with an insulating spacer 88a' having an upper end disposed on a level higher than a lower surface of the lower pad pattern 26p. The insulating spacer 88a' may be in contact with the upper pad pattern 30p.

Figure 5C:
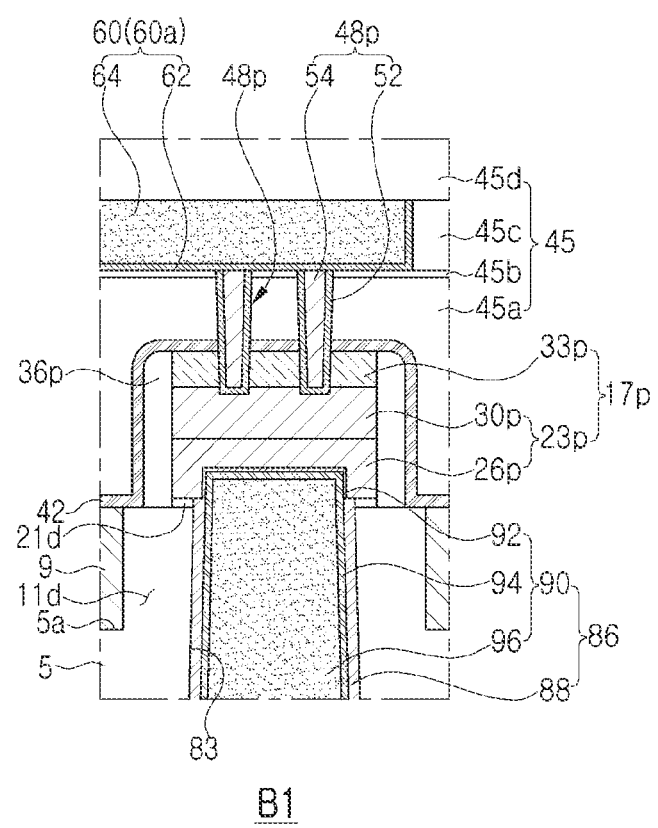

In a modified example, referring to FIG. 5C, the through-electrode structure 86 described in FIG. 2A may penetrate through the dummy active region 11d, defined by the device isolation layer 9, and may be in contact with the internal pad pattern 23p. Accordingly, the through-electrode structure 86 may be spaced apart from the device isolation layer 9. A dummy dielectric layer 21d may be disposed between the dummy active region 11d and the internal input/output conductive pattern 23p, and the through-electrode structure 86 may penetrate through the dummy dielectric layer 21d and may be in contact with the input/output conductive pattern 23p.

Figure 5D:
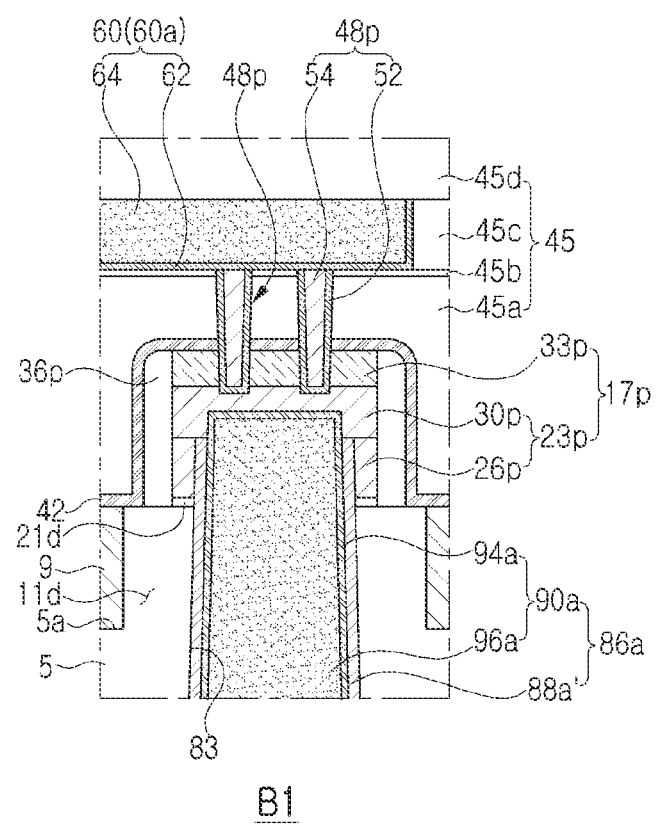

In a modified example, referring to FIG. 5D, the through-electrode structure 86a described in FIGS. 5A and 5B may penetrate through the dummy active region 11d and the dummy dielectric layer 21d as described in FIG. 5C, and may extend inwardly of the internal input/output conductive pattern 23p. As illustrated in FIGS. 5A and 5B, the through-electrode 90a of the through-electrode structure 86a may include a portion penetrating through the lower pad pattern 26p and being in contact with the upper pad pattern 30p. As an example, as illustrated in FIG. 5B, the insulating spacer 88a' of the through-electrode structure 86a may be in contact with the upper pad pattern 30p. As another example, as illustrated in FIG. 5A, the insulating spacer 88a of the through-electrode structure 86a may be spaced apart from the upper pad pattern 30p and may be in contact with the lower pad pattern 26p.

Figure 5E:
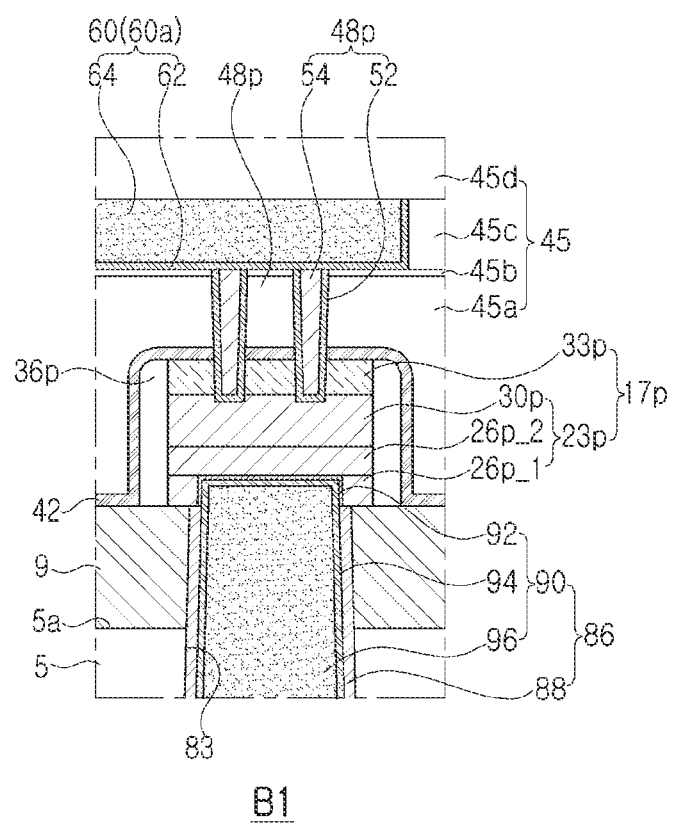

In a modified example, referring to FIG. 5E, the lower pad pattern 26p in FIGS. 5A to 5D may include a first lower pad layer 26p_1 and a second lower pad layer 26p_2 stacked in order. For example, the lower pad pattern 26p in FIG. 2A may include the first lower pad layer 26p_1 and the second lower pad layer 26p_2 stacked in order, and the through-electrode structure 86 may penetrate through the first lower pad layer 26p_1 and may be in contact with the second lower pad layer 26p_2. As another example, the through-electrode structure 86 may be in contact with the first lower pad layer 26p_1 and may be spaced apart from the second lower pad layer 26p_2.

Figure 6:
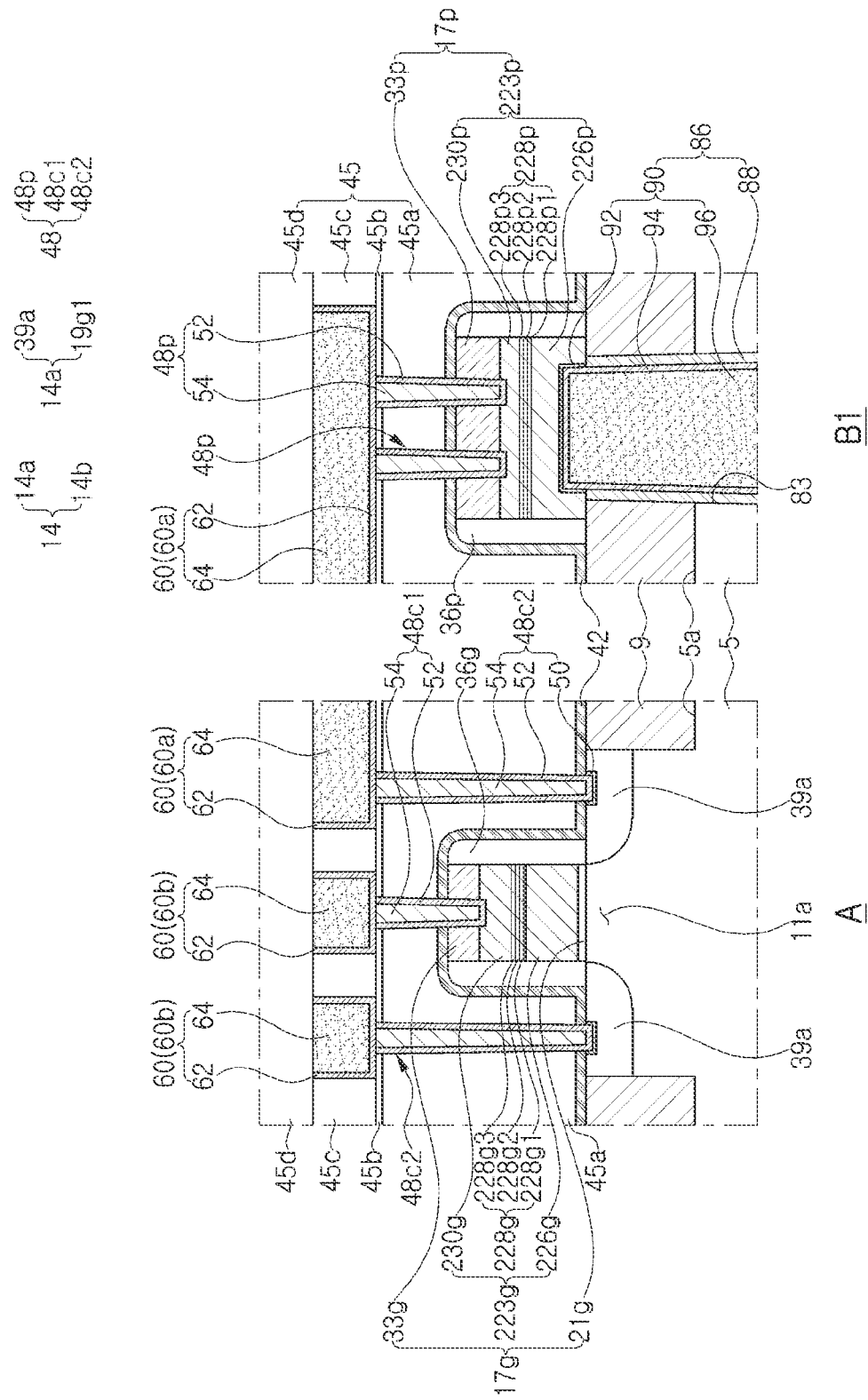

Next, a modified example of the gate electrode 23g and the internal input/output conductive pattern 23p in FIG. 2A will be described with reference to FIG. 6. FIG. 6 is a partially enlarged cross-sectional view corresponding to the partially enlarged cross-sectional view of FIG. 2A, and may illustrate a modified example of the gate electrode 23g in a region denoted by "A" of FIG. 2A and a modified example of the internal input/output conductive pattern 23p in a region denoted by "B1" of FIG. 2A. Hereinafter, when various modified examples of the gate electrode 23g and the internal input/output conductive pattern 23p described in FIG. 2A are described with reference to FIG. 6, contents able to be easily understood from the descriptions will be omitted and elements, other than the gate electrode 23g and the internal input/output conductive pattern 23*p*, will be described through direct citations without additional descriptions.

Referring to FIG. 6, the gate electrode (23*g* of FIG. 2A) may be replaced with a gate electrode 223*g* including a lower gate pattern 226*g*, a middle gate pattern 228*g*, and an upper gate pattern 230*g* stacked in order, and the internal input/output conductive pattern (23*p* of FIG. 2A) may be replaced with an internal input/output conductive pattern 223*p* including a lower pad pattern 226*p*, a middle pad pattern 228*p*, and an upper pad pattern 230*p* stacked in order.

The lower gate pattern 226*g* and the lower pad pattern 226*p* may be formed of the same material and may have the same thickness. The lower gate pattern 226*g* and the lower pad pattern 226*p* may be substantially the same as the lower gate pattern 26*g* and the lower pad pattern 26*p* described in FIG. 2A. For example, each of the lower gate pattern 226*g* and the lower pad pattern 226*p* may be formed as a layer of doped polysilicon.

The middle gate pattern 228*g* and the middle pad pattern 228*p* may be formed of the same material and may have the same thickness.

In an example embodiment, each of the middle gate pattern 228*g* and the middle pad pattern 228*p* may have a multilayer structure. For example, each of the middle gate pattern 228*g* and the middle pad pattern 228*p* may have a multilayer structure including at least two layers, among a metal nitride layer, a metal layer, and a metal-semiconductor compound layer. For example, the middle gate pattern 228*g* may include a first middle gate layer 228*g*1, a second middle gate layer 228*g*2, and a third middle gate layer 228*g*3 stacked in order, and the middle pad pattern 228*p* may include a first middle pad layer 228*p*1, a second middle pad layer 228*p*2, and a third middle pad layer 228*p*3 stacked in order. For example, the first middle gate layer 228*g*1 and the first middle pad layer 228*p*1 may include a metal nitride layer (for example, a TiN layer, or the like), and the second middle gate layer 228*g*2 and the second middle pad layer 228*p*2 may include a metal layer (for example, a tungsten (W) layer, or the like), and the third middle gate layer 228*g*3 and the third middle pad layer 228*p*3 may include a metal-semiconductor compound layer (for example, a tungsten silicon (WSi) layer, or the like) and a metal-semiconductor-nitride compound layer (for example, a tungsten silicon nitride (WSiN) layer, or the like).

The upper gate pattern 230*g* and the upper pad pattern 230*p* may be formed of the same material and may have the same thickness. The upper gate pattern 230*g* and the upper pad pattern 230*p* may include a metal layer (for example, a W layer, or the like).

A through-electrode structure 86, having substantially the same cross-sectional structure as the through-electrode structure 86 described in FIG. 2A, may be disposed. The through-electrode structure 86 may be in contact with the lower pad pattern 226*p* of the internal input/output conductive pattern 23*p*, and may be spaced apart from the middle pad pattern 228*p* and the upper pad pattern 230*p*.

Next, various modified examples of the region denoted by "B1" of FIG. 6 will be described with reference to FIGS. 7A to 7E, respectively. FIGS. 7A to 7E are partially enlarged cross-sectional views corresponding to the region denoted by "B1" in FIG. 6, and may illustrate various modified examples of the through-electrode structure 86 in FIG. 6. Hereinafter, when various modified examples of the through-electrode structure 86 described in FIG. 6 are described with reference to FIGS. 7A to 7E, respectively, contents able to be easily understood from the descriptions provided with reference to FIGS. 2, 5A to 5E, and 6 will be omitted and elements, other than the through-electrode structure 86, will be described through direct citations without additional descriptions.

Figure 7A:
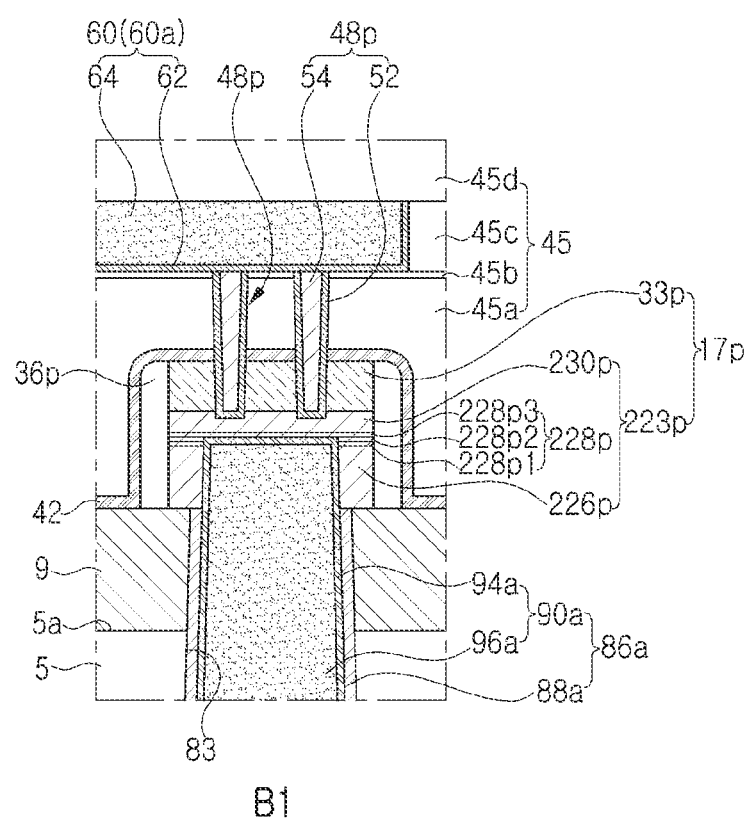

In a modified example, referring to FIG. 7A, the through-electrode structure 86 in FIG. 6 may be replaced with a through-electrode structure 86*a* having substantially the same cross-sectional structure as the through-electrode structure 86*a* described in FIG. 5A. The through-electrode 90*a* of the through-electrode structure 86*a* may penetrate through the lower pad pattern 226*p*. For example, the through-electrode 90*a* may be in contact with at least the middle pad pattern 228*p*. In another example, the through-electrode 90*a* of the through-electrode structure 86*a* may sequentially penetrate through the lower pad pattern 226*p* and the middle pad pattern 228*p*, and may be in contact with the upper pad pattern 230*p*.

Hereinafter, unless otherwise described, it will be understood that an upper surface of the through-electrode 90*a* is in contact with the middle pad pattern 228*p* or the upper pad pattern 230*p*.

The insulating spacer 88*a* of the through-electrode structure 86*a* may be in contact with a lower surface of the lower pad pattern 226*p*.

Figure 7B:
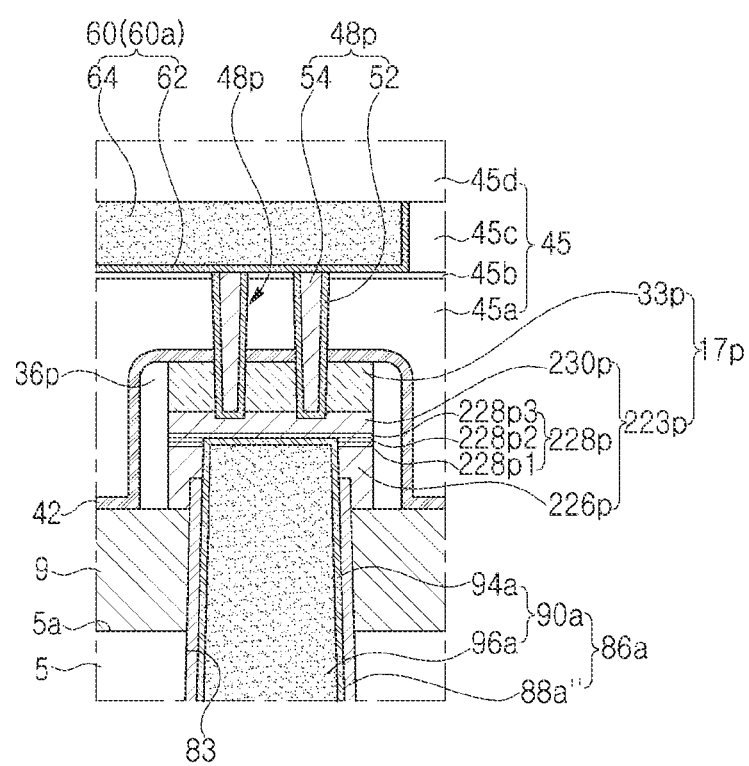

In a modified example, referring to FIG. 7B, the insulating spacer 88*a* in FIG. 7A may be replaced with an insulating spacer 88*a"* extending inwardly of the lower pad pattern 226*p* and spaced apart from the middle pad pattern 228*p*.

Figure 7C:
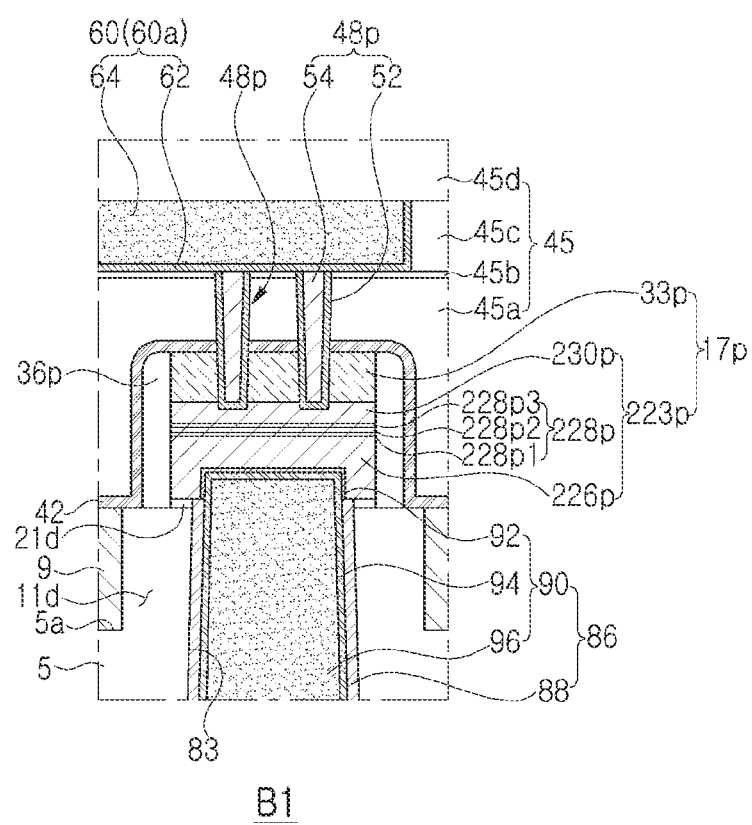

In a modified example, referring to FIG. 7C, similarly to the description in FIG. 5C, the through-electrode structure 86 in FIG. 6 may penetrate through the dummy active region 11*d* defined by the device isolation layer 9 and may be in contact with the internal input/output conductive pattern 223*p*. Accordingly, the through-electrode structure 86 may be spaced apart from the device isolation layer 9. Similarly to the description in FIG. 5C, a dummy dielectric layer 21*d* may be disposed between the dummy active region 11*d* and the internal input/output conductive pattern 23*p*, and the through-electrode structure 86 may penetrate through the dummy dielectric layer 21*d* and may be in contact with the internal input/output conductive pattern 223*p*.

Figure 7D:
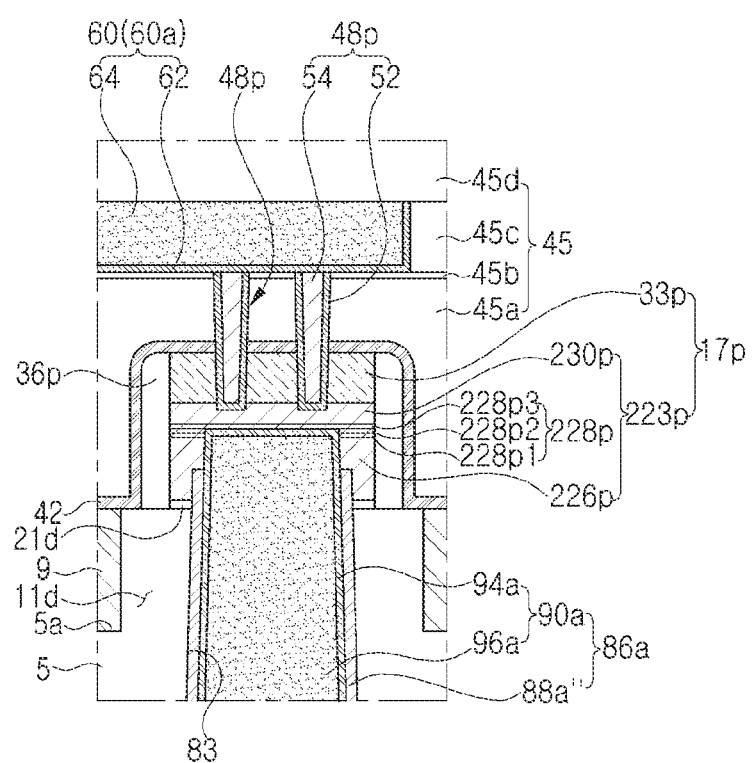

In a modified example, referring to FIG. 7D, the through-electrode structure 86*a* described in FIG. 7B may penetrate through the dummy active region 11*d* and the dummy dielectric layer 21*d* as described in FIG. 7C, and may extend inwardly of the internal input/output conductive pattern 223*p*.

Figure 7E:
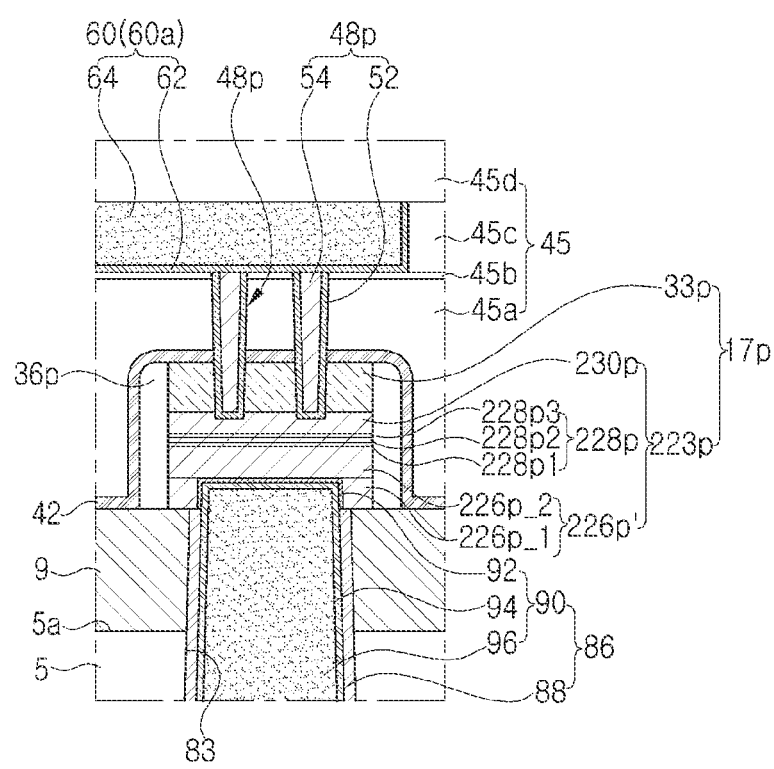

In a modified example, referring to FIG. 7E, the lower pad pattern 226*p* in FIGS. 7A to 7C may be replaced with a lower pad pattern 226*p*' including a first lower pad layer 226*p*_1 and a second lower pad layer 226*p*_2 stacked in order.

Figure 8:
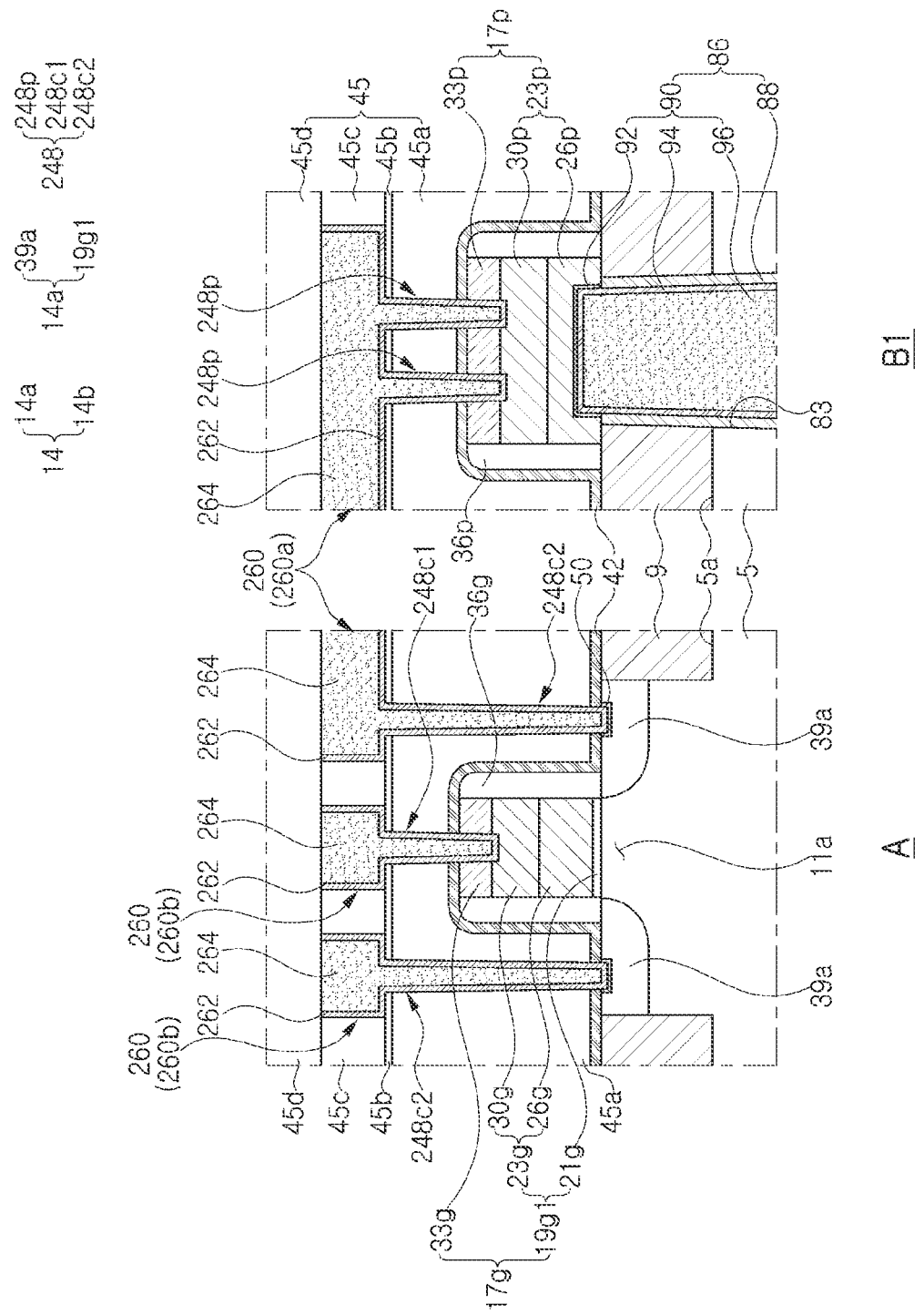

Next, a modified example of the contact plugs 48 and the lower interconnections 60 in FIG. 2A will be described with reference to FIG. 8. FIG. 8 is a partially enlarged cross-sectional view corresponding to the partially enlarged cross-sectional view of FIG. 2A. Hereinafter, when modified examples of the contact plugs 48 and the lower interconnections 60 described in FIG. 2A are described with reference to FIG. 8, contents able to be easily understood from the descriptions will be omitted and elements, other than the contact plugs 48 and the lower interconnections 60 in FIG. 2A, will be described through direct citations without additional descriptions.

In a modified example, referring to FIG. 8, among contact plugs 248 in the modified example and the lower interconnections 260, contact plugs 248 and lower interconnections 260 electrically connected to each other may be formed to be integrated with each other. For example, the contact plugs 248 and the lower interconnections 260 electrically connected to each other and formed to be integrated with each other may include a metal pattern 264 and a barrier layer 262 covering a side surface and a lower surface of the metal pattern 264.

The lower interconnections 260 may include input/output connection wirings 260a and circuit wirings 260b, respectively corresponding to the input/output connection wirings 60a and the circuit wirings 60b in FIG. 2A. The contact plugs 248 may include an input/output connection contact plug 248p disposed to be in contact with and electrically connected to the internal input/output conductive pattern 23p, first contact plugs 248c1 disposed to be respectively in contact with and electrically connected to the first and second source/drain regions 39a and 39b of the peripheral circuit 14, and second contact plugs 248c2 disposed to be respectively in contact with and electrically connected to the first and second gate electrodes 19g1 and 19g2 of the peripheral circuit 14. For example, the second contact plug 248c2 of one of the first and second contact plugs 248c1 and 248c2, electrically connected to each other and electrically connected to the first circuit device 14a, the input/output connection wiring 260a, and the input/output connection contact plug 248p may be formed to be integrated with each other, and may include a single metal pattern 264 and a single barrier layer 262 covering a side surface and a lower surface of the metal pattern 264.

Figure 9A:
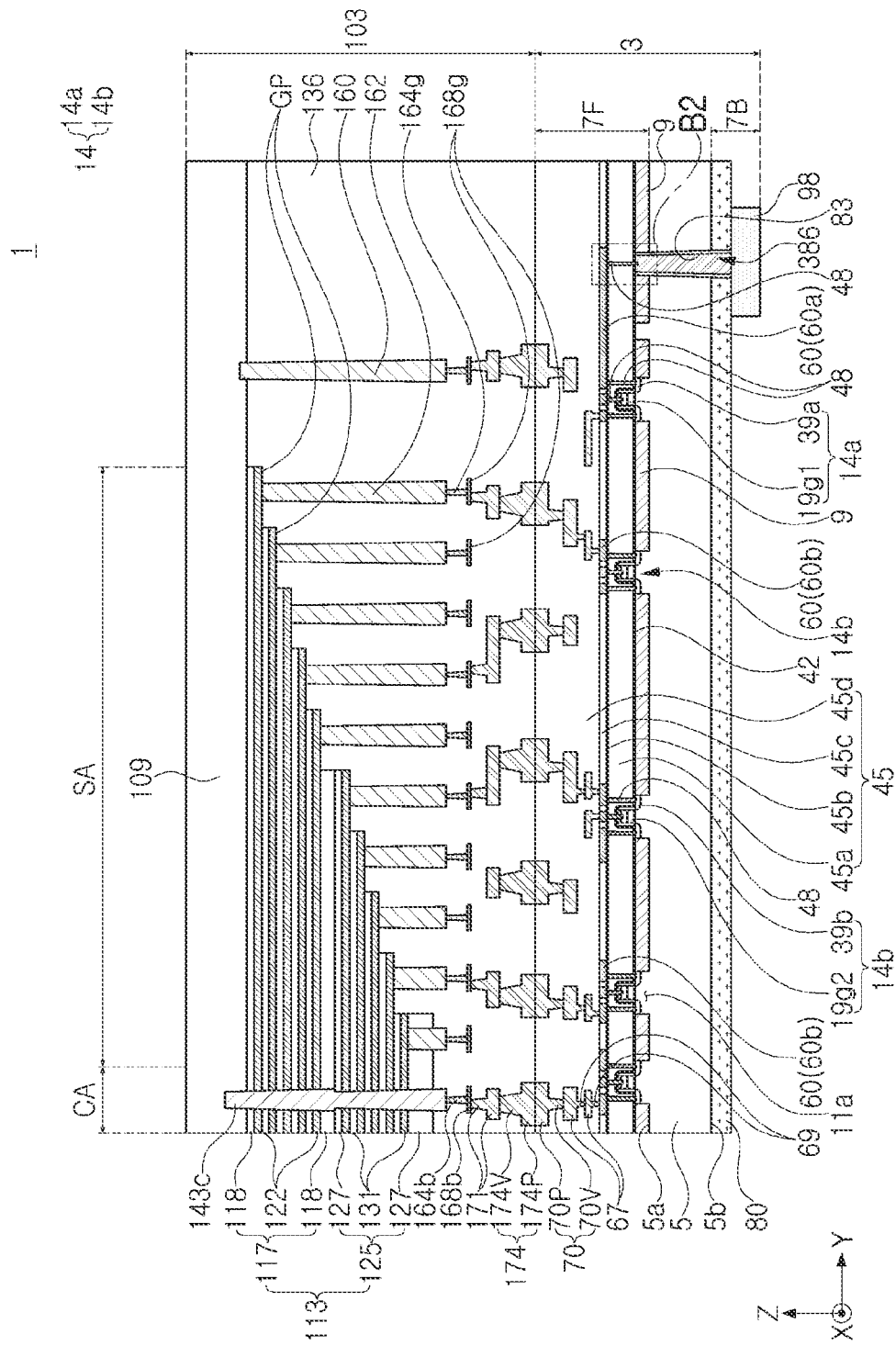
FIG. 9A is a schematic cross-sectional view illustrating a modified example of a semiconductor device according to an example embodiment.
Figure 9B:
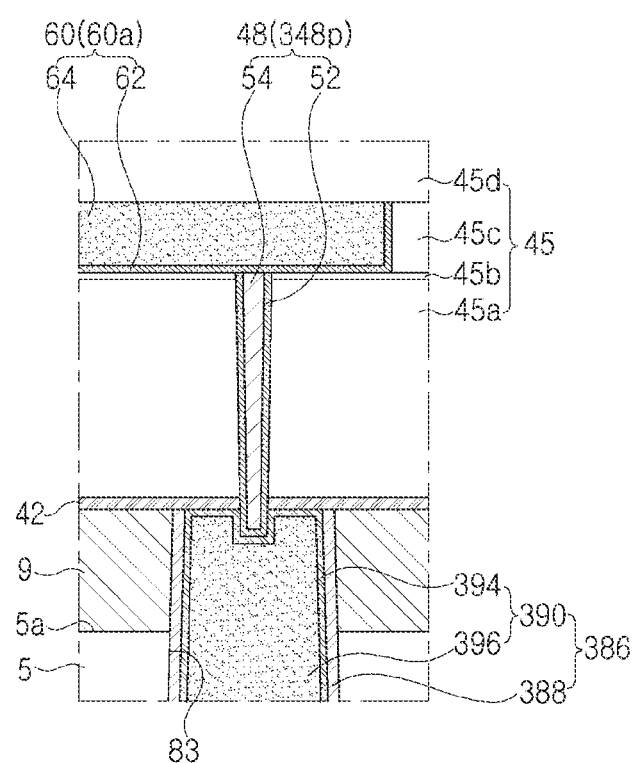
FIG. 9B is an enlarged cross-sectional view of a portion of FIG. 9A.

Next, various modified examples of the pad stack pattern 17p including the internal input/output conductive pattern (23p in FIG. 2A) described on with reference to FIGS. 9A and 9B, the through-electrode structure (86 in FIG. 2A), and the input/output connection contact plug 48p will be described. FIG. 9A is a cross-sectional view corresponding to FIG. 1, and FIG. 9B is a partially enlarged view of a region denoted by "B2" of FIG. 9A. Hereinafter, when modified examples of the pad stack pattern 17p described in FIGS. 1 and 2A, the through-electrode structure (86 of FIG. 2A), and the input/output connection contact plug 48p are described with reference to FIGS. 9A and 9B, contents able to be easily understood from the descriptions will be omitted and elements, other than the pad stack pattern 17p described in FIGS. 1 and 2A, the through-electrode structure (86 of FIG. 2A), and the input/output connection contact plug 48p, will be described through direct citations without additional descriptions.

In a modified example, referring to FIGS. 9A and 9B, the pad stack pattern 17p including the internal input/output conductive pattern (23p of FIG. 2A) described in FIGS. 1 and 2A may be omitted. Among the contact plugs 48 described in FIGS. 1 and 2A, the input/output connection contact plug (48p in FIG. 2A) may be replaced with an input/output connection contact plug 348p, to which the input/output connection wiring 60a is electrically connected, having a lower end extending downwardly from a portion in contact with the input/output connection wiring 60a to be disposed on a lower level than an upper surface of the device isolation layer 9.

The input/output connection contact plug 348p may include the plug pattern 54 and the barrier layer 52 covering a side surface and a bottom surface of the plug pattern 54, as described in FIG. 2A.

The through-electrode structure (86 of FIG. 2A) may be replaced with a through-electrode structure 386 disposed in the through-hole 83, penetrating through the back side insulating layer 80, the semiconductor substrate 5, and the device isolation layer 9, and disposed to be in contact with the input/output connection contact plug 348p. The through-electrode structure 386 may include a through-electrode 390 and an insulating spacer 388 surrounding a side surface of the through-electrode 390. The through-electrode 390 may include an electrode pattern 396 and a barrier layer 394 covering a side surface and an upper surface of the electrode pattern 396. The electrode pattern 396 and the barrier layer 394 may be formed of the same materials as the electrode pattern 96 and the barrier layer 94 described in FIG. 2A, respectively.

The insulating liner 42 described in FIG. 2A may cover the upper surface of the device isolation layer 9 and may cover an upper surface of the through-electrode structure 386, and the input/output connection contact plug 348p may penetrate through the insulating liner 42 and may be in contact with the through-electrode structure 386.

In an example embodiment, a lower end of the input/output connection contact plug 348p may be disposed on a lower level than the upper surface of the through-electrode structure 386.

In embodiments, the input/output connection contact plug 348p, disposed to be in contact with the through-electrode structure 386, may be referred to as an "internal input/output conductive pattern."

In an example embodiment, the barrier layer 52 of the input/output connection contact plug 348p may be in contact with the barrier layer 394 of the through-electrode 390.

Figure 10:
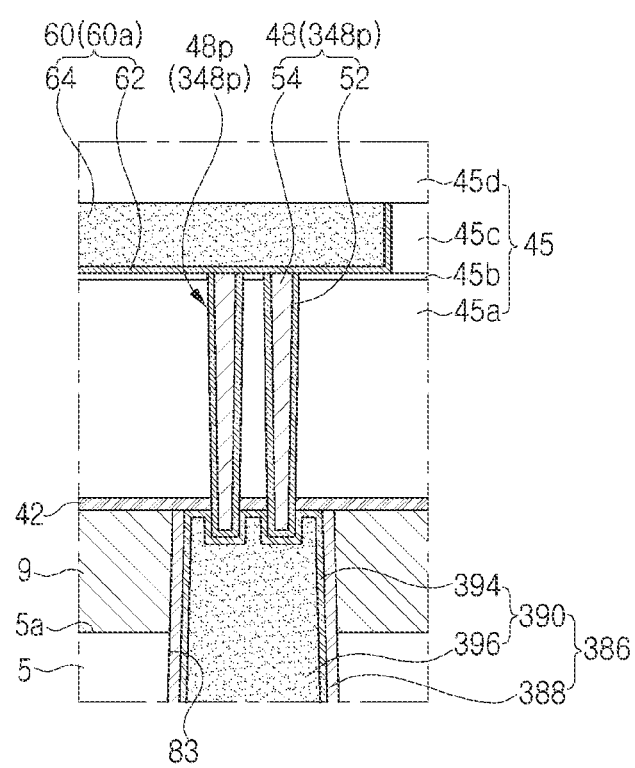
FIGS. 10 to 11G are partially enlarged cross-sectional views illustrating modified examples of a semiconductor device according to an example embodiment, respectively.

The input/output connection contact plugs 348p may be provided with a single input/output connection contact plug 348p or a plurality of input/output connection contact plugs 348p. For example, as illustrated in FIG. 10, the input/output connection contact plugs 348p may be provided with a plurality of the input/output connection contact plugs 348p, and the plurality of input/output connection contact plugs 348p may be in contact with the through-electrode 390. FIG. 10 is a partially enlarged cross-sectional view illustrating the number of the input/output connection contact plugs 348p is increased in a region denoted by "B2" of FIG. 9B.

In the following drawings, the input/output connection contact plug 348p are illustrated as being provided with a plurality of input/output connection contact plugs 348p, but the input/output connection contact plug 348p according to the present disclosure may be provided with a single input/output connection contact plug 348p. Therefore, the input/output connection contact plug 348p illustrated or described below may be provided with a single input/output connection contact plug 348p or a plurality of the input/output connection contact plugs 348p.

Next, various modified examples of the region denoted by "B2" of FIG. 9B will be described with reference to FIGS. 11A to 11G, respectively. FIGS. 11A to 11G are partially enlarged cross-sectional views corresponding to the region denoted by "B2" of FIG. 9B, and may illustrate various modified examples of the through-electrode structure 386 and/or the input/output connection contact plug 348p in FIG. 9B. Hereinafter, when modified examples of the through-electrode structure 386 and/or the input/output connection contact plug 348p in FIG. 9B are described with reference to FIGS. 11A and 11B, contents able to be easily understood from the descriptions will be omitted and unmodified elements will be described through direct citations without additional descriptions.

Figure 11A:
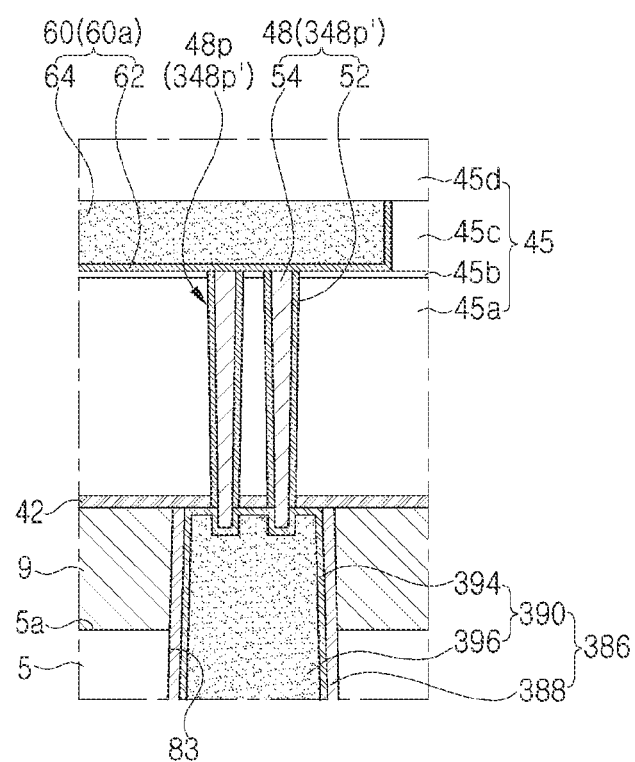

In a modified example, referring to FIG. 11A, an input/output connection contact plug 348p' in the modified example may include a plug pattern 54, disposed to be in contact with the barrier layer 394 of the through-electrode 390, and a barrier layer 52 surrounding a side surface of the plug pattern 54 disposed not to be in contact with the barrier layer 394 of the through-electrode 390 may be included. The barrier layer 394 of the through-electrode 390 may be in contact with a lower surface of the plug pattern 54 and a portion of a side surface of the plug pattern 54.

Figure 11B:
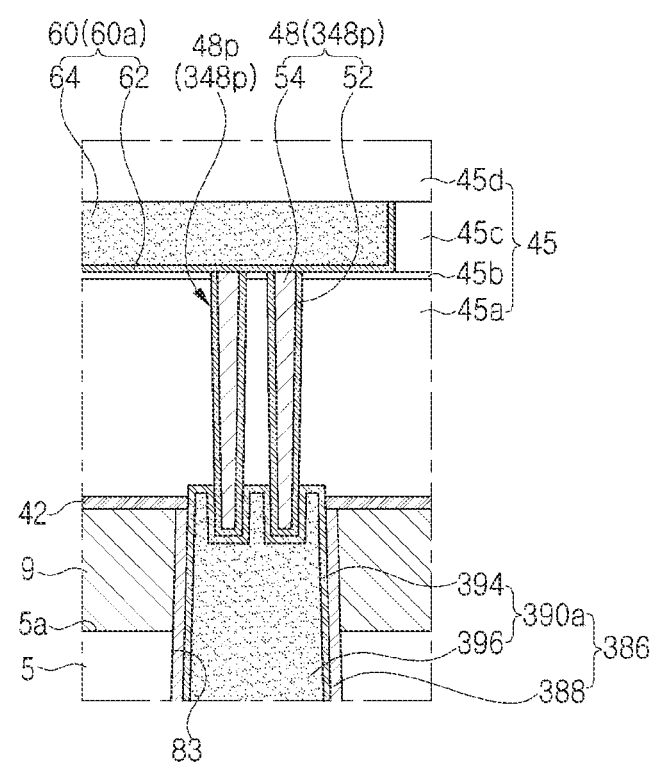

In a modified example, referring to FIG. 11B, the through-electrode 390 described in FIG. 9B may be replaced with a through-electrode 390a further including a portion penetrating through the insulating liner 42 and extending inwardly of the first insulating layer 45a. An upper surface of the through-electrode 390a may be disposed on a level higher than an upper end of the insulating spacer 388.

Figure 11C:
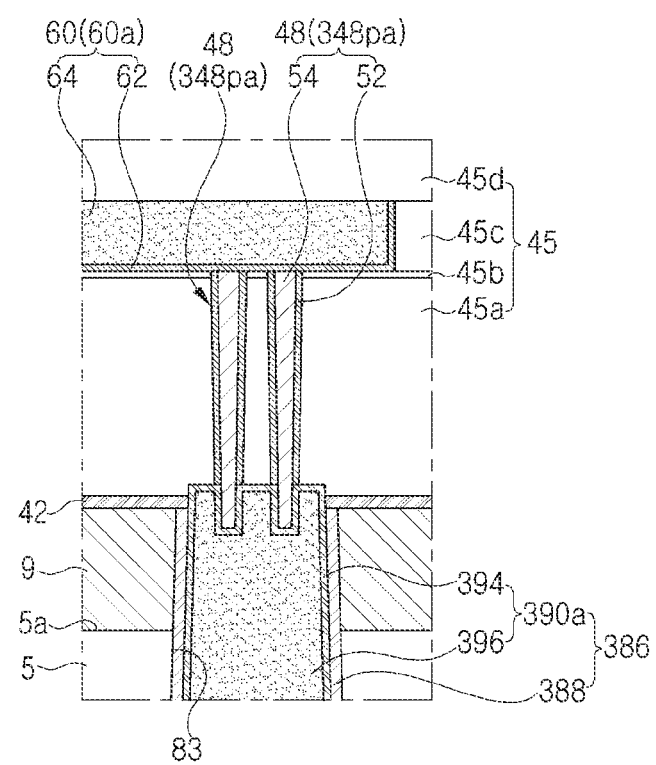

In a modified example, referring to FIG. 11C, the input/output connection contact plug 348pa in the modified example may include a plug pattern 54, disposed to be in contact with the barrier layer 394 of the through-electrode 390a, and a barrier layer 52 surrounding a side surface of the plug pattern 54 disposed not be in contact with the barrier layer 394 of the through-electrode 390a, similarly to the description in FIG. 11B.

Figure 11D:
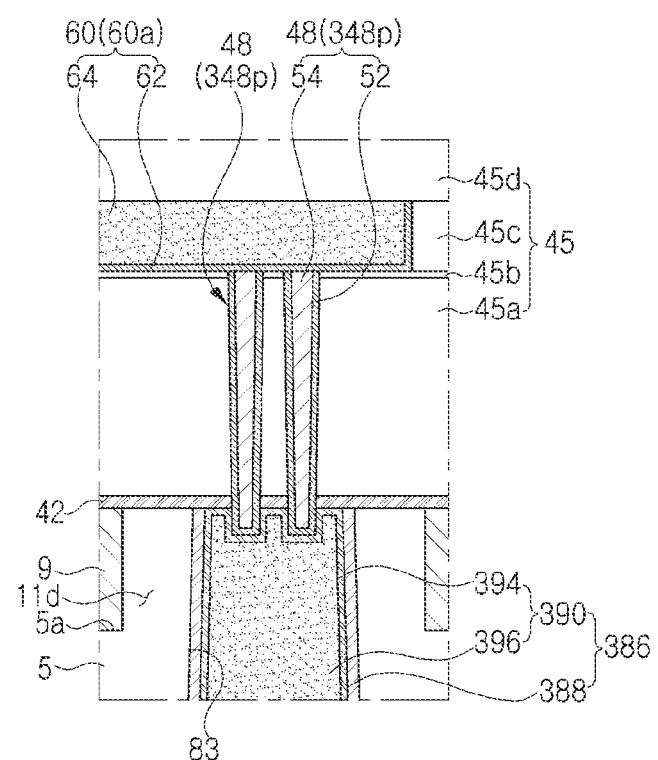

In a modified example, referring to FIG. 11D, the through-electrode structure 386 described in FIG. 9B may penetrate through a dummy active region 11d defined by the device isolation layer 9 described in FIG. 5C. The through-electrode structure 386 may be in contact with the input/output connection contact plug 348p, similarly to the description in FIG. 9B.

Figure 11E:
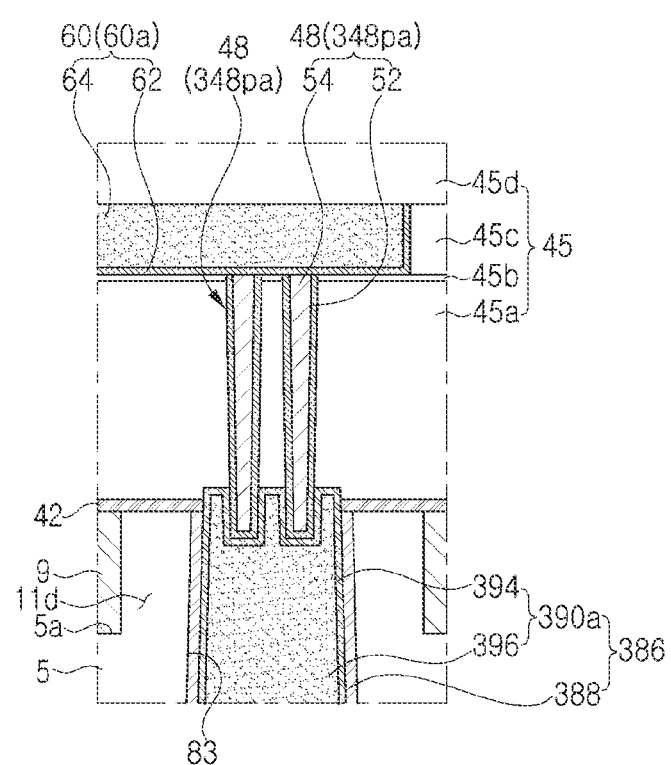

In a modified example, referring to FIG. 11E, the through-electrode (390 in FIG. 9B) of the same through-electrode structure 386 as described in FIG. 11C may be replaced with a through-electrode 390a further including a portion penetrating through the insulating liner 42 and extending inwardly of the first insulating layer 45a, similarly to the description of FIG. 11C.

Figure 11F:
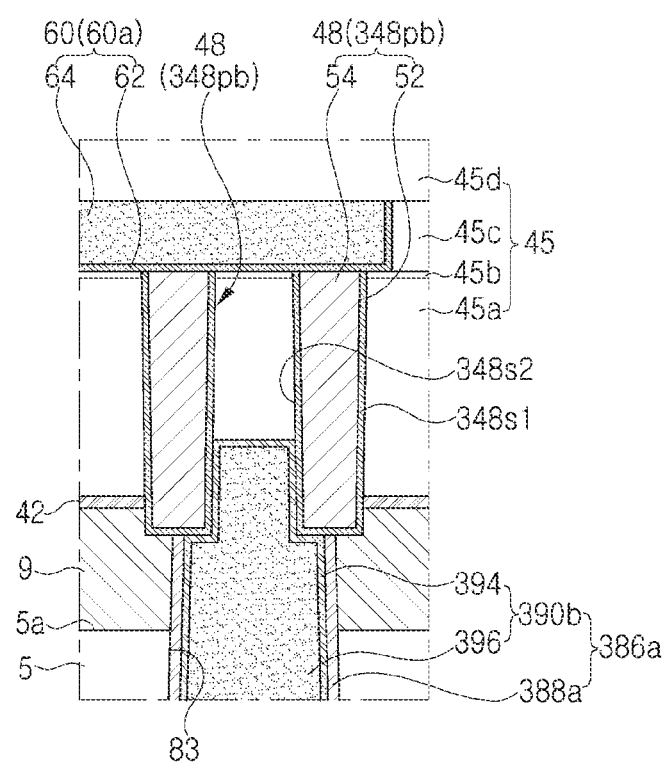

In a modified example, referring to FIG. 11F, at least a portion of a side surface of the through-electrode structure 386a in the modified example may overlap an input/output connection contact plug 348pb in the modified example. The through-electrode structure 386a may include a through-electrode 390b and an insulating spacer 388a surrounding at least a portion of a side surface of the through-electrode 390b, and an upper end of the insulating spacer 388a may be in contact with the input/output connection contact plug 348pb. The input/output connection contact plug 348pb may be provided with a plurality of input/output connection contact plugs 348pb.

The input/output connection contact plug 348pb may have a bar shape, a circular shape, a rectangular shape, or a ring shape, in a plan view.

The through-electrode 390b may extend upwardly from a portion in contact with a lower surface of the input/output connection contact plug 348pb while being in contact with one side surface 348s2 of both side surfaces 348s1 and 348s2.

An upper surface of the through-electrode 390b may be disposed on a level higher than a lower surface of the input/output connection contact plug 348pb, and may be disposed on a lower level than a lower surface of the input/output connection wiring 60a.

Similarly to the description in FIG. 9B, the through-electrode 390b may include the electrode pattern 396 and the barrier layer 394 covering a side surface and an upper surface of the electrode pattern 396. The input/output connection contact plug 348pb may include the plug pattern 54 and the barrier layer 52 covering a side surface and a bottom surface of the plug pattern 54, as described in FIG. 2A. The barrier layer 52 of the input/output connection contact plug 348pb and the barrier layer 394 of the through-electrode 390b may be in contact with each other, and the plug pattern 54 of the input/output connection contact plug 348pb may be spaced apart from the through-electrode 390b.

Figure 11G:
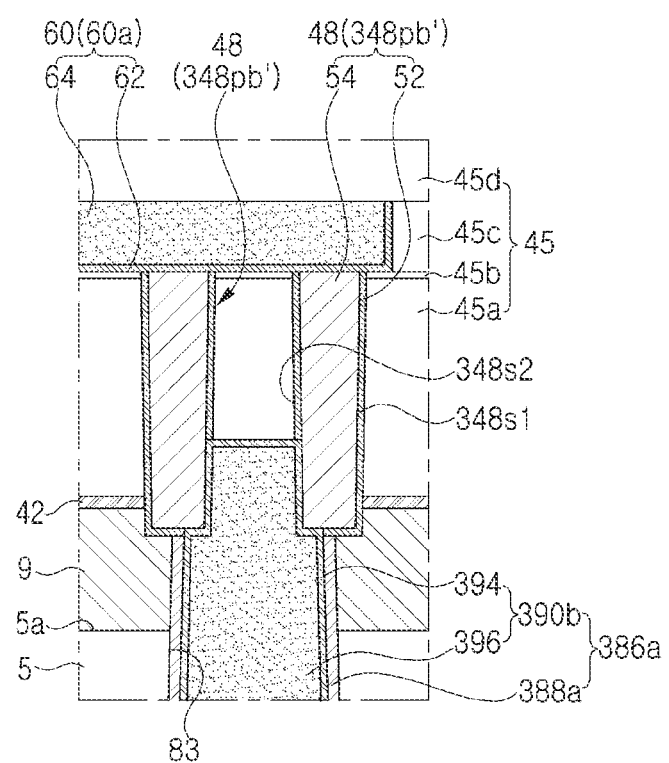

In a modified example, referring to FIG. 11G, an input/output connection contact plug 348pb' in the modified example may include a plug pattern 54, disposed to be in contact with the barrier layer 394 of the through-electrode 390b, and a barrier layer 52 surrounding a side surface of the plug pattern 54 disposed not to be in contact with the barrier layer 394 of the through-electrode 390b, as illustrated in FIG. 11F.

Figure 12:
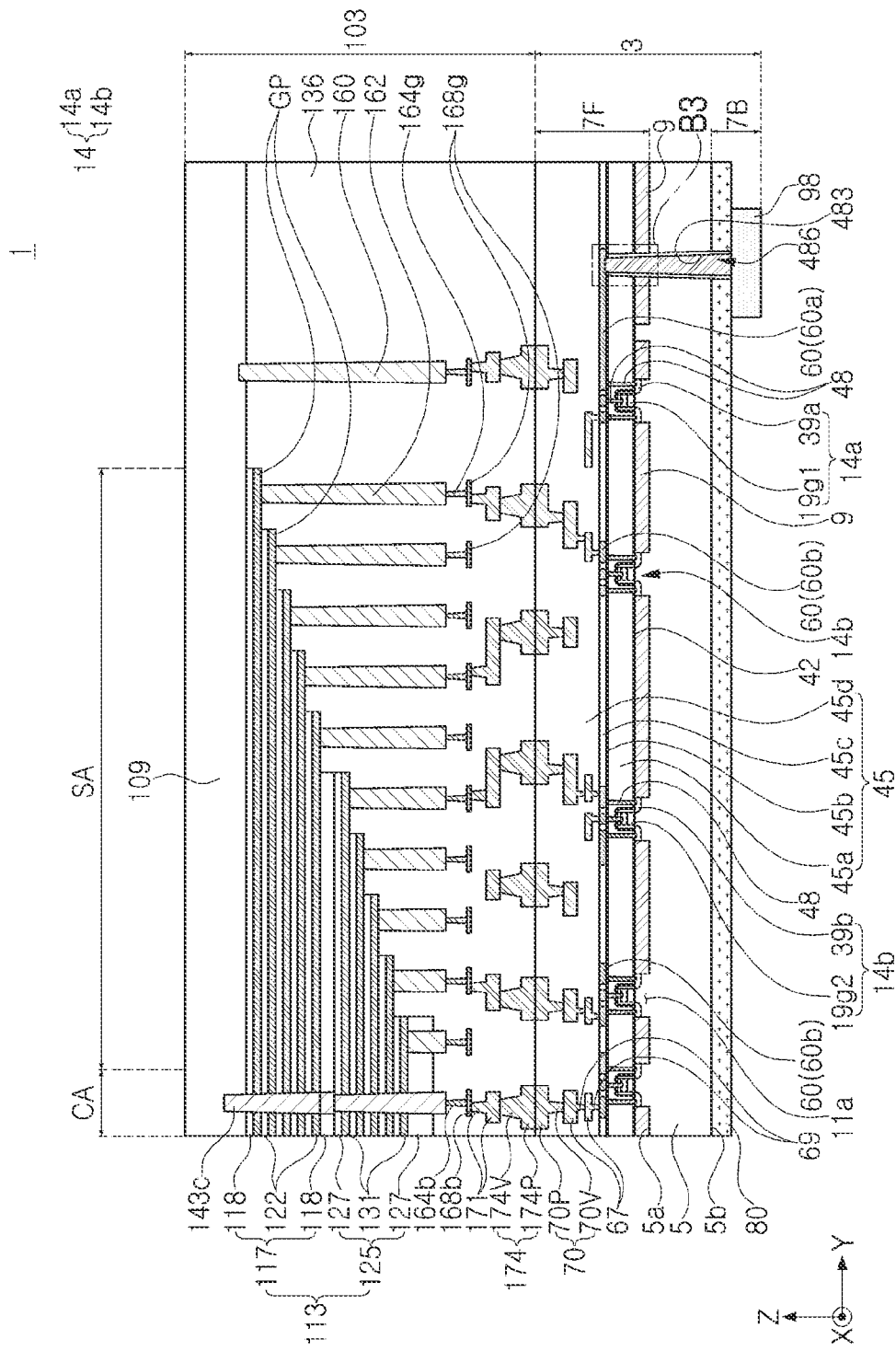
FIG. 12 is a schematic cross-sectional view illustrating a modified example of a semiconductor device according to an example embodiment.
Figure 13:
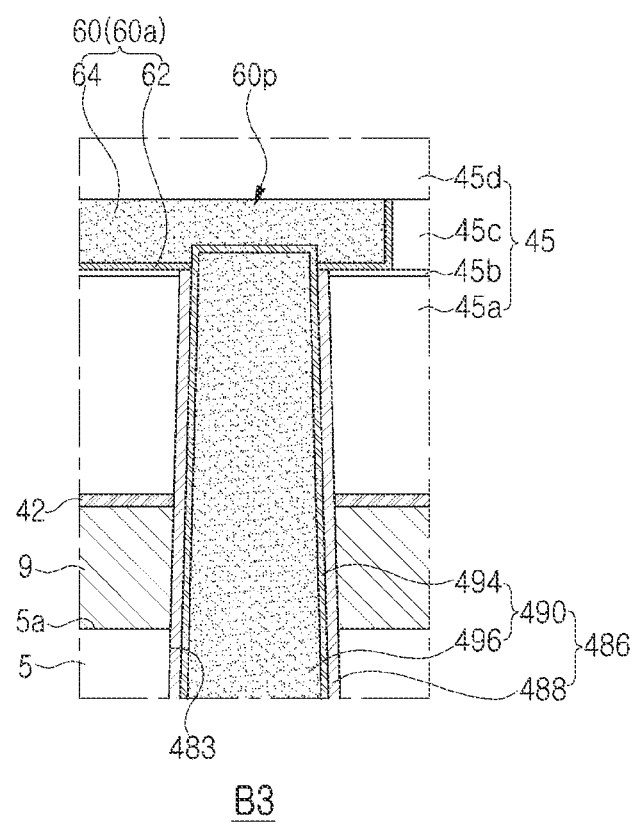
FIG. 13 is an enlarged cross-sectional view of a portion of FIG. 12.

Next, various modified examples of the pad stack pattern 17p including the internal input/output conductive pattern (23p in FIG. 2A), the through-electrode structure (86 in FIG. 2A), and the input/output connection contact plug 48p will be described with reference to FIGS. 12 and 13. FIG. 12 is a cross-sectional view corresponding to FIG. 1, and FIG. 13 is a partially enlarged view of a region denoted by "B3" in FIG. 12. Hereinafter, when modified examples of the pad stack pattern 17p, the through-electrode structure (86 of FIG. 2A), and the input/output connection contact plug 48p described in FIGS. 1 and 2A are described with reference to FIGS. 12 and 13, contents able to be easily understood from the descriptions will be omitted and elements, other than the internal input/output conductive pattern (23p of FIG. 2A), the through-electrode structure (86 of FIG. 2A), and the input/output connection contact plug 48p, will be described through direct citations without additional descriptions.

In a modified example, referring to FIGS. 12 and 13, the pad stack pattern 17p including the internal input/output conductive pattern (23p of FIG. 2A), described in FIGS. 1 and 2A, may be omitted. Among the contact plugs 48 described in FIGS. 1 and 2A, the input/output connection contact plug (48p of FIG. 2A) may be omitted. The through-electrode structure 86, disposed in the through-hole 83 described in FIGS. 1 and 2A, may be replaced with a through-electrode structure 486 disposed in a through-hole 483 penetrating through the back side insulating layer 80, the semiconductor substrate 5, the device isolation layer 9, and the insulating liner 42, the first insulating layer 45a, and the second insulating layer 45b and exposing the input/output wiring 60a. Accordingly, the through-electrode structure 486 may be in contact with and electrically connected to the input/output wiring 60a and the back side input/output conductive pattern 98 between the input/output wiring 60a and the back side input/output conductive pattern 98 described in FIGS. 1 and 2A.

In embodiments, in the input/output wiring 60a, a region 60p of the input/output wiring 60a, disposed to be in contact with the through-electrode structure 486, may be referred to as an "internal input/output conductive pattern" or an "internal input/output pad region."

The through-electrode structure 486 may include a through-electrode 490 and an insulating spacer 488 surrounding at least a portion of a side surface of the through-electrode 490. The through-electrode 490 may include an electrode pattern 496 and a barrier layer 494 covering side and upper surfaces of the electrode pattern 496. The electrode pattern 496 and the barrier layer 494 may be formed of the same materials as the electrode pattern 96 and the barrier layer 94 described in FIG. 2A, respectively. The through-electrode 490 may further include a portion extending inwardly of the input/output wiring 60a. Accordingly, an upper surface of the through-electrode 490 may be disposed on a level higher than the lower surface of the input/output wiring 60*a*. The upper surface of the through-electrode 490 may be disposed on a level higher than an upper end of the four-wing insulating spacer 388.

Figure 14A:
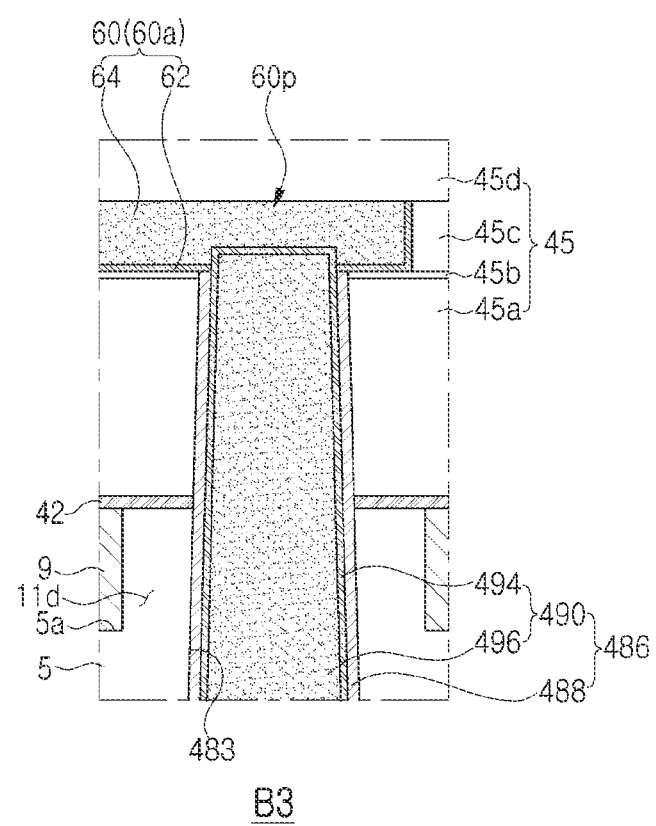
FIGS. 14A and 14B are partially enlarged cross-sectional views illustrating modified examples of a semiconductor device according to an example embodiment, respectively.
Figure 14B:
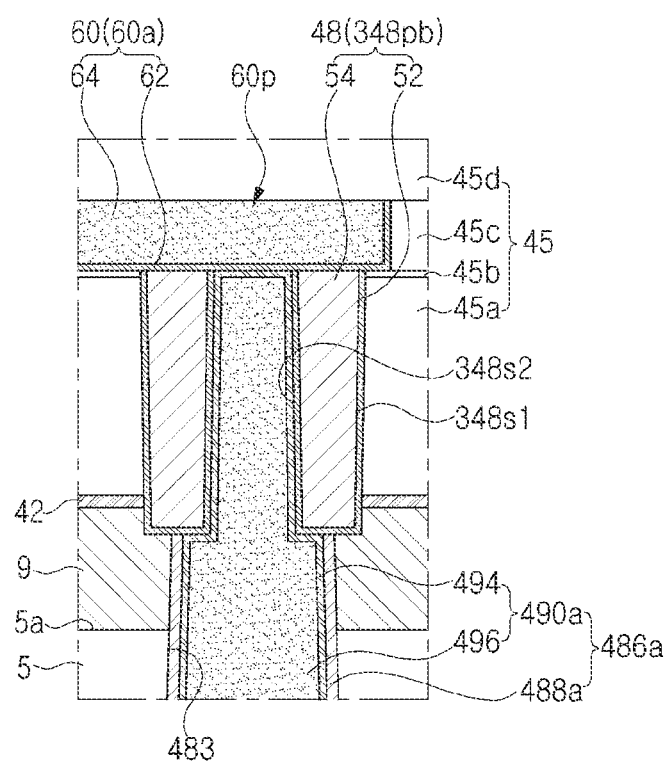

Next, various modified examples of a region denoted by "B3" of FIG. 13 will be described with reference to FIGS. 14A and 14B, respectively. FIGS. 14A and 14B are partially enlarged cross-sectional views corresponding to the region denoted by "B3" of FIG. 13, and may illustrate various modified examples of the through-electrode structure 486 in contact with the input/output wiring 60*a*. Hereinafter, modified examples of the through-electrode structure 486 in FIG. 13 will be described with reference to FIGS. 14A and 14B, respectively.

In a modified example, referring to FIG. 14A, the through-electrode structure 486 described in FIG. 13 may include a portion penetrating through a dummy active region 11*d* defined by the device isolation layer 9, similarly to the description in FIG. 5C. Accordingly, the through-electrode structure 486 may penetrate through the back side insulating layer 80, the semiconductor substrate 5, the dummy active region 11*d*, the insulating liner 42, the first insulating layer 45*a*, and the second insulating layer 45*b*, and may be electrically connected to the input/output wiring 60*a*.

In a modified example, referring to FIG. 14B, the input/output connection contact plug 348*pb*, substantially the same as described in FIG. 11F, may be disposed below the input/output connection line 60*a*. The through-electrode structure 486, described in FIG. 13, may be replaced with a through-electrode structure 486*a* disposed to be in contact the input/output connection line 60*a* while being in contact with the input/output connection contact plug 348*pb*. For example, at least a portion of a side surface of the through-electrode structure 486*a* may overlap the input/output connection contact plug 348*pb*.

The through-electrode structure 486*a* may include a through-electrode 490*a* and an insulating spacer 488*a* surrounding at least a portion of a side surface of the through-electrode 490*a*, and an upper end of the insulating spacer 488*a* may be in contact with the input/output connection contact plug 348*pb*. The input/output connection contact plug 348*pb* may be provided with a plurality of input/output connection contact plugs 348*pb*.

The through-electrode 490*a* may extend upwardly from a portion in contact with a lower surface of the input/output connection contact plug 348*pb* while being in contact with one side surface 348*s*2 of both side surfaces 348*s*1 and 348*s*2 of the input/output connection contact plug 348*pb*, and thus, may be in contact with the input/output connection wiring 60*a*. Similarly to the description in FIG. 13, the through-electrode 490*a* may include the electrode pattern 496 and the barrier layer 494 covering a side surface and an upper surface of the electrode pattern 496.

Figure 15:
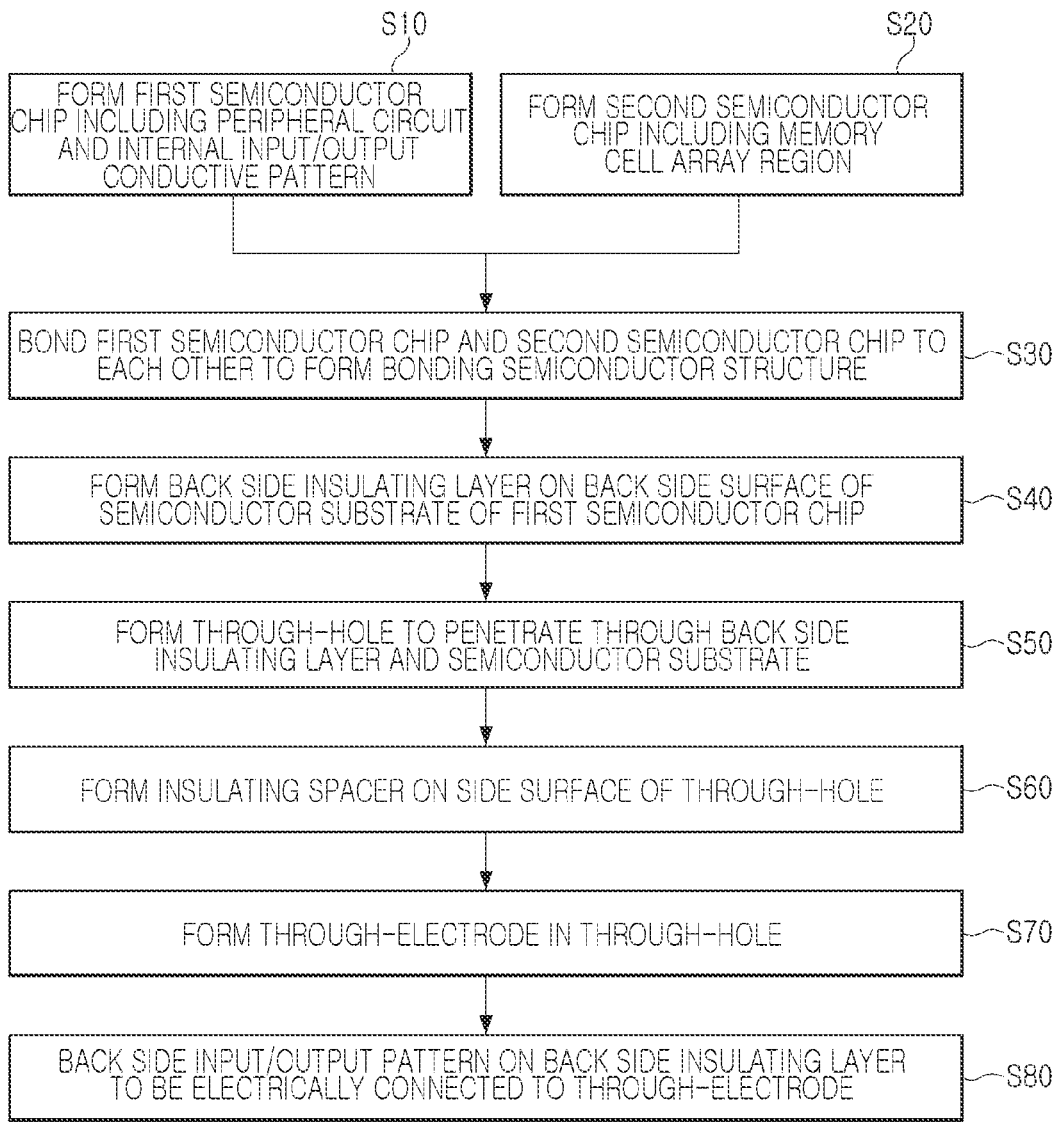
FIG. 15 is a process flowchart illustrating an example of a method of forming a semiconductor device according to an example embodiment.

Next, an example of a method of forming a semiconductor device according to an example embodiment will be described with reference to FIGS. 15 to 17. FIG. 15 is a process flowchart illustrating an example of a method of forming a semiconductor device according to an example embodiment, and FIGS. 16 and 17 are cross-sectional views illustrating an example of a method of forming a semiconductor device according to an example embodiment.

Figure 16:
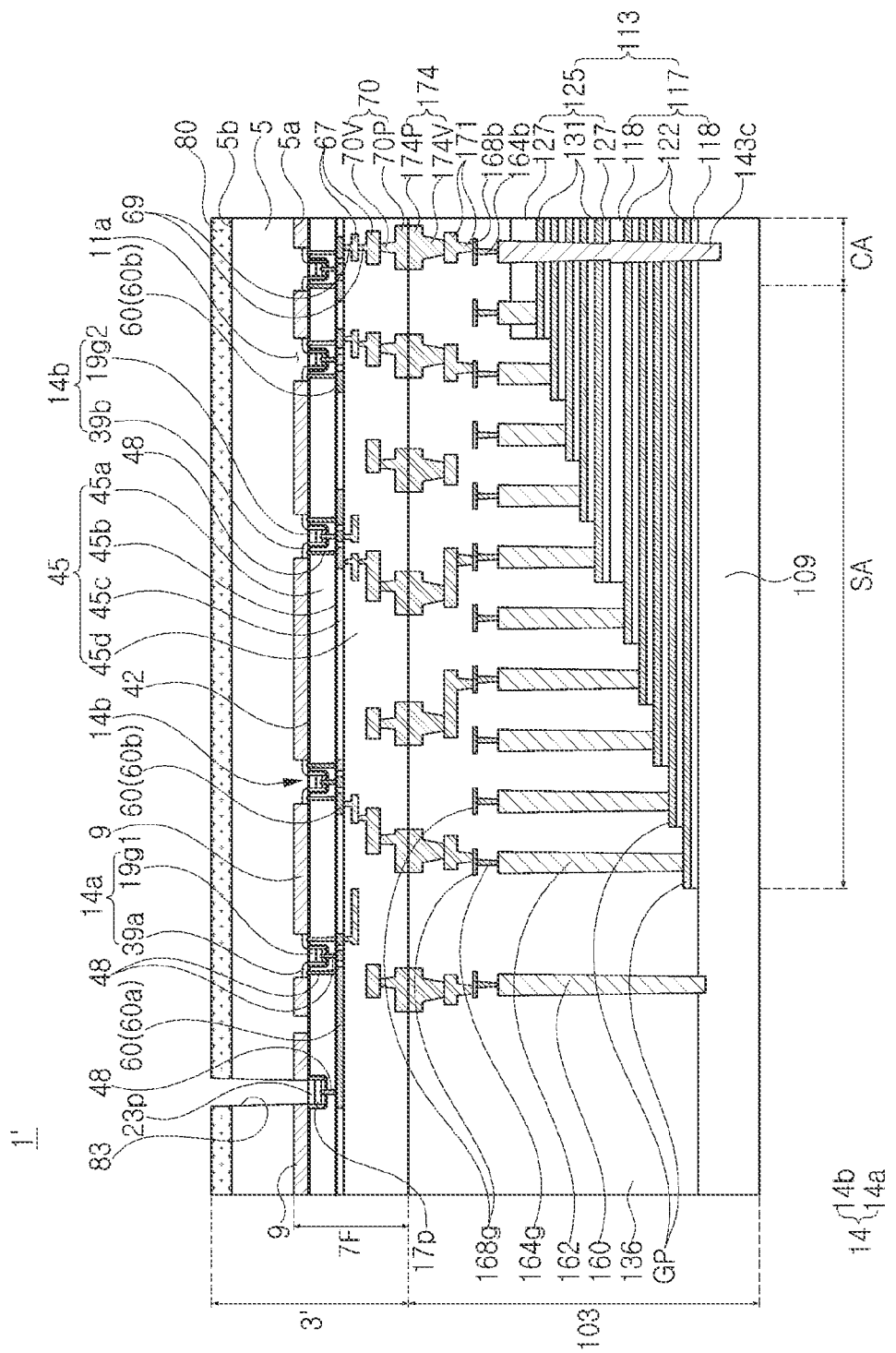
FIGS. 16 and 17 are cross-sectional views illustrating an example of a method of forming a semiconductor device according to an example embodiment.
Figure 17:
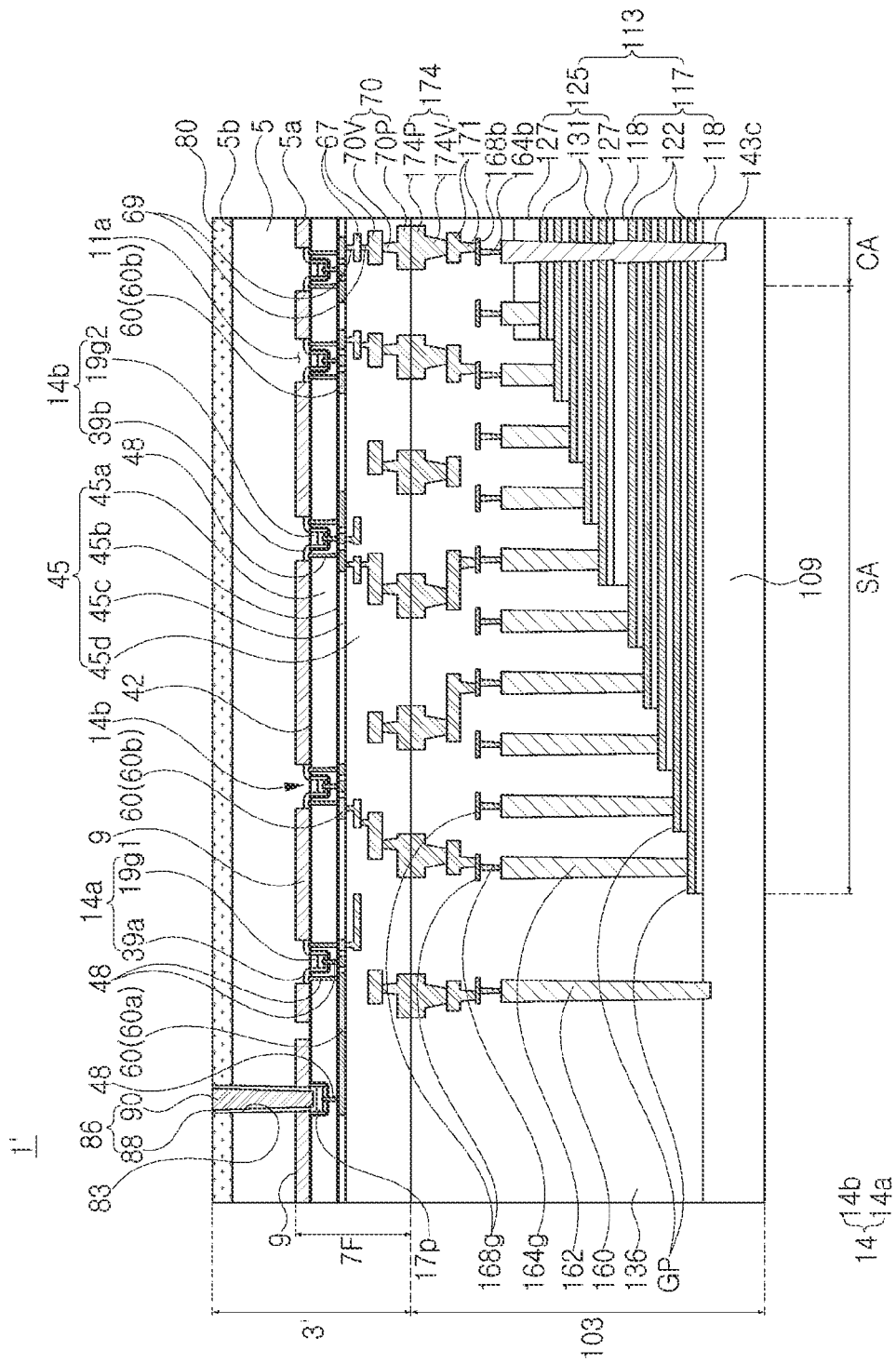

Referring to FIGS. 15 and 16, a first semiconductor chip 3' including a peripheral circuit 14 and an internal input/output conductive pattern 23*p* may be formed (S10). The first semiconductor chip 3' may include a semiconductor substrate 5 and a front side structure 7F including the peripheral circuit 14 and the internal input/output conductive pattern 23*p* on a front surface 5*a* of the semiconductor substrate 5. The front side structure 7F may be the same as the front side structure (7F of FIG. 1) of the first structure 3 described with reference to FIGS. 1 and 2. For example, the front side structure 7F may be formed by performing a semiconductor process on the front surface 5*a* of the semiconductor substrate 5. The front side structure 7F may further include the contact plugs 48, the first insulating structure 45, the plurality of upper interconnections 67, the plurality of wiring vias 69, and the first bonding patterns 70, which have been described in FIG. 1.

A second semiconductor chip 103 including the memory cell array region CA may be formed (S20). The second semiconductor chip 103 may be substantially the same as the second structure described in FIG. 1. Accordingly, the second semiconductor chip 103 may further include the staircase region SA of the second structure, the pattern structure 109, the stack structure 113, the vertical memory structures 143*c*, the second insulating structure 136, and the second bonding patterns 174, which have been described in FIG. 1.

The first semiconductor chip 3' and the second semiconductor chip 103 may be bonded to each other to form a bonding semiconductor structure 1' (S30). The forming of the bonding semiconductor structure 1' may include performing a wafer bonding process to bond the first bonding patterns 70 and the first insulating structure 45 of the first semiconductor chip 3' and the second bonding patterns 174 and the second insulating structure 136 of the second semiconductor chip 103 to each other.

In the bonding semiconductor structure 1', a back-grinding process of grinding a rear surface 5*b* of the semiconductor substrate 5 may be performed to form a semiconductor substrate 5 having a reduced thickness. A back side insulating layer 80 may be formed on the rear surface 5*b* of the semiconductor substrate 5 of the first semiconductor chip 3' (S40). The front surface 5*a* of the semiconductor substrate 5 may be referred to as a first surface or front side, and the rear surface of the semiconductor substrate 5 formed to have a reduced thickness may be referred to as a second surface or a back side.

A through-hole 83 may be formed to penetrate through the back side insulating layer 80 and the semiconductor substrate 5 (S50). The through-hole 83 may expose the internal input/output conductive pattern 23*p*.

Referring to FIGS. 15 and 17, an insulating spacer 88 may be formed on a side surface of the through-hole 83 (S60). A through-electrode 90 may be formed in the through-hole 83 (S70). The insulating spacer 88 may be formed to surround a side surface of the through-electrode 90. The insulating spacer 88 and the through-electrode 90 may constitute a through-electrode structure 86.

Returning to FIG. 15 together with FIG. 1, a back side input/output conductive pattern 98 may be formed on the back side insulating layer 80 to be electrically connected to the through-electrode 90 (S80). Thus, a semiconductor device 1 connected to the back side input/output conductive pattern 98 may be formed.

Figure 18:
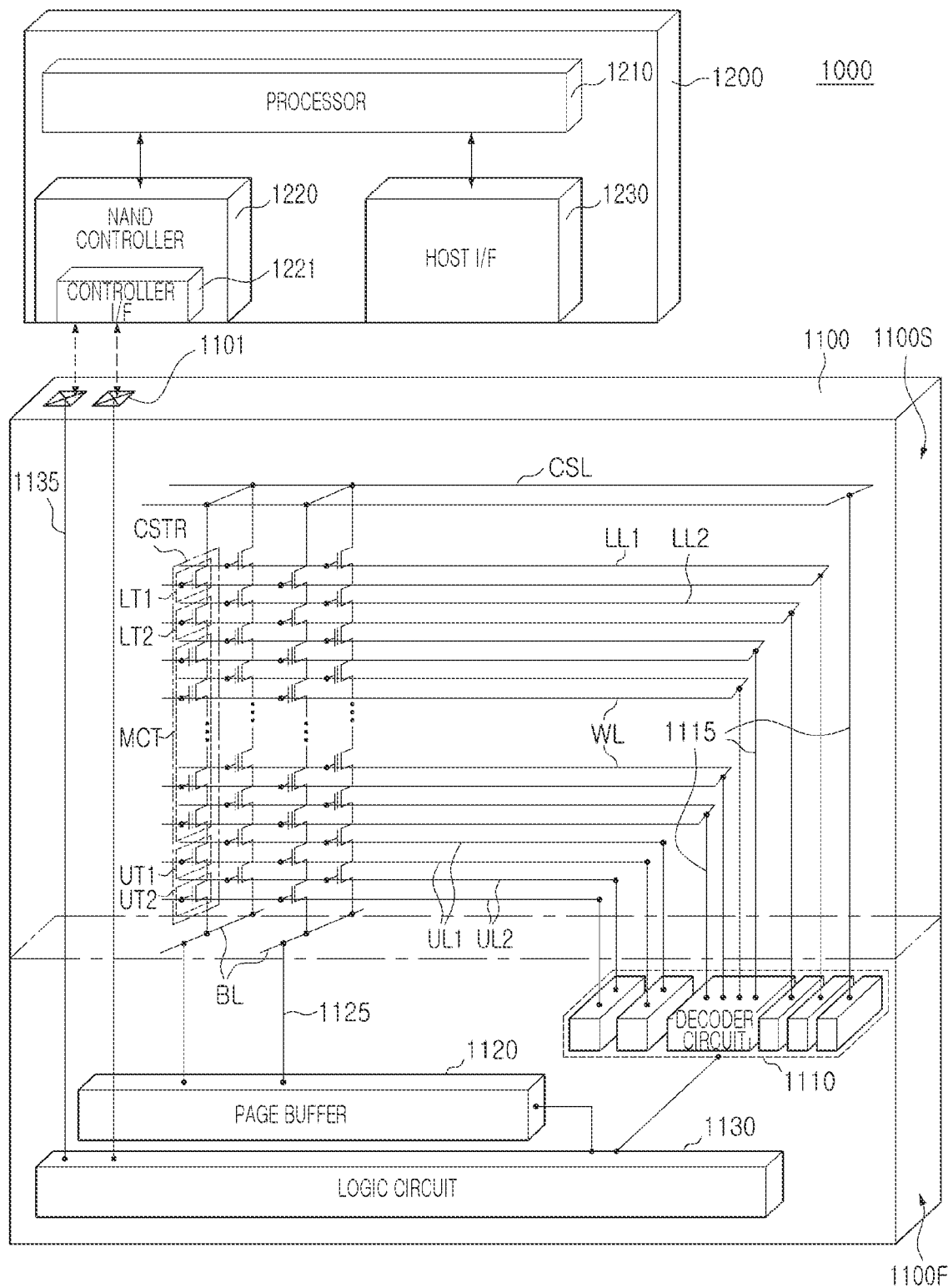
FIG. 18 is a schematic view of a data storage system including a semiconductor device according to an example embodiment.

Hereinafter, an electronic system including a semiconductor device according to an example embodiment will be described with reference to FIG. 18. FIG. 18 is a schematic view of a data storage system including a semiconductor device according to an example embodiment.

Referring to FIG. 18, a data storage system 1000 according to an example embodiment may include a semiconductor device 1100 and a controller 1200 electrically connected to the semiconductor device 1100. The data storage system 1000 may be a storage device including one or more semiconductor devices 1100, or an electronic device including a storage device. For example, the data storage system 1000 may be a solid state drive device (SSD), a universal serial bus (USB), a computing system, a medical device, or a communication device, including one or more semiconductor devices 1100.

The semiconductor device 1100 may be a nonvolatile memory device, for example, a semiconductor device according to one of the example embodiments described with reference to FIGS. 1 to 14B. The semiconductor device 1100 may include a first structure 1100F and a second structure 1100S on the first structure 1100F.

In an example embodiment, the first structure 1100F may be the first structure 3 in one of the example embodiments described in FIGS. 1 to 14B, and the second structure 1100S may be the second structure 103 in one of the example embodiments described with reference to FIGS. 1 to 14B.

The first structure 1100F may be a peripheral circuit structure including a decoder circuit 1110, a page buffer 1120, and a logic circuit 1130. In an example embodiment, the peripheral circuit 14 of the first structure 3 in one of the example embodiments described with reference to FIGS. 1 to 14B may be a peripheral circuit structure including a decoder circuit 1110, a page buffer 1120, and a logic circuit 1130.

The second structure 1100S may be a vertical memory structure including a bitline BL, a common source line CSL, wordlines WL, first and second upper gate lines UL1 and UL2, and first and second lower gate lines LL1 and LL2, and memory cell strings CSTR between the bitline BL and the common source line CSL.

In an example embodiment, the bitlines BL may be the bitlines 168*b* in one of the example embodiments described with reference to FIGS. 1 to 14B.

In an example embodiment, the common source line CSL may be at least a portion of the pattern structure 109, for example, a polysilicon layer having N-type conductivity in the pattern structure 109.

In an example embodiment, the first and second lower gate lines LL1 and LL2, the wordlines WL, and the first and second upper gate lines UL1 and UL2 may be the gate layers 122 and 131 of the stack structure (113 of FIG. 1) according to one of the example embodiments described with reference to FIGS. 1 to 9B. Accordingly, the gate layers 122 and 131 of the stack structure (113 in FIG. 1) may include the first and second lower gate lines LL1 and LL2, the wordlines WL, and the first and second upper gate lines UL1 and UL2. At least some of the first and second lower gate lines LL1 and LL2 and the first and second upper gate lines UL1 and UL2 may be select gate electrodes.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary in example embodiments. The plurality of memory cell transistors MCT may include data storage regions, capable of storing data. For example, the data storage layer 145*b* of the data storage structure 145, as described in FIG. 3, may include data storage regions.

In example embodiments, the upper transistors UT1 and UT2 may include a string select transistor, and the lower transistors LT1 and LT2 may include a ground select transistor. The lower gate lines LL1 and LL2 may be gate electrodes of lower transistors LT1 and LT2, respectively. The wordlines WL may be gate electrodes of memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used in an erase operation to erase data, stored in the memory cell transistors MCT, using gate-induced drain leakage (GIDL).

The common source line CSL, the first and second lower gate lines LL1 and LL2, the wordlines WL, and the first and second upper gate lines UL1 and UL2 may be electrically connected to the decoder circuit 1110 through first connection wirings 1115 extending from the inside of the first structure 1100F to the second structure 1100S. The bitlines BL may be electrically connected to the page buffer 1120 through second connection wirings 1125 extending from the inside of the first structure 1100F to the second structure 1100S.

In the first structure 1100F, the decoder circuit 1110 and the page buffer 1120 may perform a control operation on at least one selected memory cell transistor, among the plurality of memory cell transistors MCT. The decoder circuit 1110 and the page buffer 1120 may be controlled by a logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending from the inside of the first structure 1100F to the second structure 1100S.

In an example embodiment, the input/output pad 1101 may be electrically connected to the external input/output conductive pattern 98 in one of the example embodiments described with reference to FIGS. 1 to 14B.

The controller 1200 may include a processor 1210, a NAND controller 1220, and a host interface 1230. According to example embodiments, the data storage system 1000 may include a plurality of semiconductor devices 1100. In this case, the controller 1200 may control the plurality of semiconductor devices 1100.

The processor 1210 may control all operations of the data storage system 1000 including the controller 1200. The processor 1210 may operate depending on predetermined firmware, and may control the NAND controller 1220 to access the semiconductor device 1100. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 19:
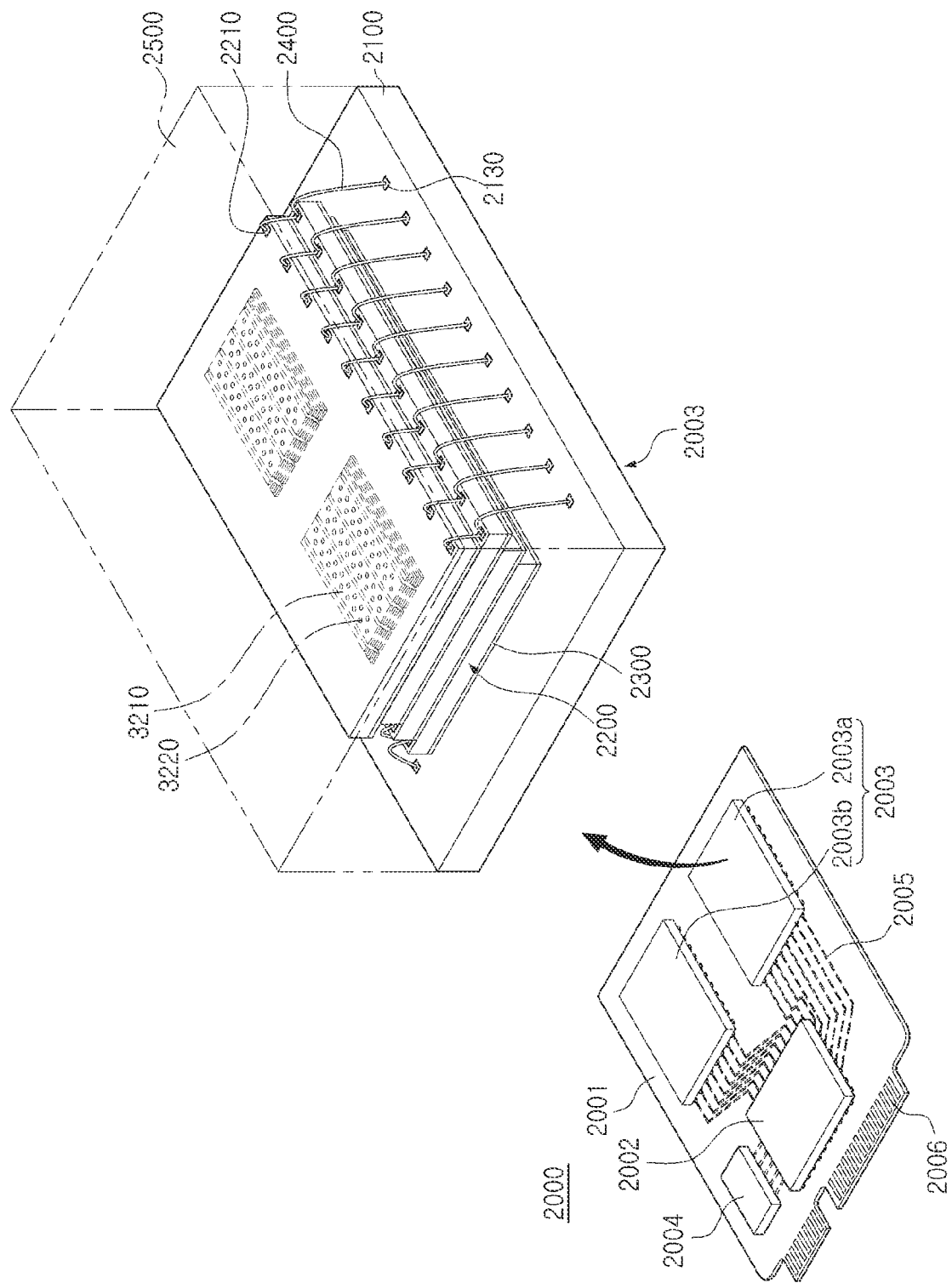
FIG. 19 is a schematic perspective view of a data storage system including a semiconductor device according to an example embodiment.

Hereinafter, an electronic system including a semiconductor device according to an example embodiment will be described with reference to FIG. 19. FIG. 19 is a schematic perspective view of a data storage system including a semiconductor device according to an example embodiment.

Referring to FIG. 19, a data storage system 2000 according to an example embodiment may include a main substrate 2001, a controller 2002 mounted on the main substrate 2001, one or more semiconductor packages 2003, and a dynamic random access memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with the external host using one of interfaces such as universal serial bus (USB), peripheral component interconnect express (PCI-Express), serial advanced technology attachment (SATA), and M-PHT for universal flash storage (UFS). In example embodiments, the data storage system 2000 may operate with power supplied from an external host through the connector 2006. The data storage system 2000 may further include a power management integrated circuit (PMIC) for distributing power, supplied by the external host, to the controller 2002 and the semiconductor package 2003.

The controller 2002 may write data in the semiconductor package 2003 or may read data from the semiconductor package 2003, and may improve an operating speed of the data storage system 2000.

The semiconductor package 2003 may include first and second semiconductor packages 2003a and 2003b spaced apart from each other. Each of the first and second semiconductor packages 2003a and 2003b may be a semiconductor package including a plurality of the semiconductor chips 2200. Each of the first and second semiconductor packages 2003a and 2003b may include the package substrate 2100, the semiconductor chips 2200 on the package substrate 2100, adhesive layers 2300 respectively disposed on lower surfaces of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board (PCB) including upper package pads 2130. Each of the semiconductor chips 2200 may include an input/output pad 2210.

In an example embodiment, the input/output pad 2210 may correspond to an external input/output conductive pattern 98 of FIG. 1.

Each of the semiconductor chips 2200 may include stack structures 3210 and vertical memory structures 3220. Each of the semiconductor chips 2200 may include a semiconductor device according to one of the example embodiments described with reference to FIGS. 1 to 14B. Each of the stack structures 3210 may be a stack structure 113 according to one of the example embodiments described with reference to FIGS. 1 to 14B. The vertical memory structures 3220 may be the vertical memory structures 143c and 143c' according to one of the example embodiments described with reference to FIGS. 1 to 14B.

In example embodiments, the connection structure 2400 may be as a bonding wire electrically connecting the input/output pad 2210 and the upper package pad 2130. Accordingly, in each of the first and second semiconductor packages 2003a and 2003b, the semiconductor chips 2200 may be electrically connected to each other in a wire bonding manner, and may be electrically connected to the upper package pads 2130 of the package substrate 2100. In example embodiments, in each of the first and second semiconductor packages 2003a and 2003b, the semiconductor chips 2200 may be electrically connected to each other through a connection structure including a through silicon via (TSV), rather than the connection structure 2400 of the wire bonding manner.

In example embodiments, the controller 2002 and the semiconductor chips 2200 may be included in a single package. In an example embodiment, the controller 2002 and the semiconductor chips 2200 may be mounted on an interposer substrate different from the main substrate 2001, and the controller 2002 and the semiconductor chips 2200 may be connected to each other by a wiring formed on the interposer substrate.

As described above, according to example embodiments, a semiconductor device capable of improving integration density and reliability and a data storage system including the semiconductor device may be provided. A semiconductor device according to example embodiments may include a first structure, including a semiconductor substrate and a peripheral circuit on the semiconductor substrate, and a second structure including a memory cell array region. Since the first structure and the second structure may be located in a vertical direction, integration density of the semiconductor device may be improved.

According to example embodiments, the second structure may further include a through-electrode, penetrating through the semiconductor substrate and electrically connected to the peripheral circuit, and an external input/output conductive pattern electrically connected to the through-electrode below the semiconductor substrate. Accordingly, since an electrical path between the peripheral circuit and the external input/output conductive pattern may be significantly shortened, performance and reliability of the semiconductor device may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments have been shown and described above, it will be apparent to those skilled in the art that modifications and variations could be made without departing from the scope of the present inventive concept as defined by the appended claims.

What is claimed is:

1. A semiconductor device comprising:
a first structure including a semiconductor substrate having a first surface and a second surface opposing each other, a front side structure on the first surface of the semiconductor substrate, a back side structure below the second surface of the semiconductor substrate and a through-electrode structure including a portion penetrating through the semiconductor substrate; and
a second structure disposed on the first structure and including gate layers, stacked in a vertical direction, and a vertical memory structure penetrating through the gate layers, wherein:
the front side structure includes a first circuit device, including a first gate structure including a gate dielectric layer and a gate electrode stacked in order and a first source/drain region, and an internal input/output conductive pattern having a portion disposed on the same level as at least a portion of the gate electrode,
the back side structure includes a back side insulating layer below the second surface of the semiconductor substrate and an external input/output conductive pattern below the back side insulating layer,
the through-electrode structure includes a through-electrode, electrically connected to the external input/output conductive pattern and the internal input/output conductive pattern, and an insulating spacer on a side surface of the through-electrode,
each of the gate electrode and the internal input/output conductive pattern includes
a lower conductive pattern, and
an upper conductive pattern on the lower conductive pattern,
the front side structure includes
a gate capping pattern on the gate electrode,
a pad capping pattern on the internal input/output conductive pattern,
lower interconnections including an input/output connection wiring and a circuit wiring disposed on the same height level, and
an input/output connection contact plug electrically connecting the input/output connection wiring and the internal input/output conductive pattern to each other between a portion of the input/output connection wiring, overlapping the internal input/output conductive pattern, and the internal input/output conductive pattern,
a thickness of the gate capping pattern is substantially the same as a thickness of the pad capping pattern, and
the input/output connection contact plug penetrates through the pad capping pattern.

2. The semiconductor device of claim 1, wherein the front side structure further comprises:
a circuit contact plug electrically connecting a portion of the input/output connection wiring, overlapping the first circuit device, and the first circuit device to each other.

3. The semiconductor device of claim 2, wherein the front side structure further includes a plurality of upper interconnections disposed on different height levels, on the lower interconnections.

4. The semiconductor device of claim 3, wherein:
the front side structure further includes a second circuit device including a second gate structure and a second source/drain region, and
the second circuit device is electrically connected to the circuit wiring and the plurality of upper interconnections.

5. The semiconductor device of claim 1, wherein:
the first structure further comprises first bonding patterns, and
the second structure further comprises second bonding patterns bonded to the first bonding patterns while being in contact with the first bonding patterns.

6. The semiconductor device of claim 1, wherein:
lower conductive pattern includes a silicon layer,
the upper conductive pattern includes a single layer or a plurality of layers on the lower conductive pattern, and
the upper conductive pattern is formed of at least one of a metal nitride, a metal, and a metal-semiconductor compound, or a combination of at least two thereof.

7. The semiconductor device of claim 6, wherein the through-electrode is spaced apart from the upper conductive pattern of the internal input/output conductive pattern and is in contact with the lower conductive pattern of the internal input/output conductive pattern.

8. The semiconductor device of claim 6, wherein:
the through-electrode includes an electrode pattern, a barrier layer covering a side surface and an upper surface of the electrode pattern, and a metal-semiconductor compound layer between the barrier layer and the lower conductive pattern of the internal input/output conductive pattern, and
an upper surface of the through-electrode is disposed on a height level between a lower surface of the lower conductive pattern and an upper surface of the lower conductive pattern.

9. The semiconductor device of claim 6, wherein the through-electrode penetrates through the lower conductive pattern of the internal input/output conductive pattern and is in contact with the upper conductive pattern of the internal input/output conductive pattern.

10. The semiconductor device of claim 1, wherein:
the through-electrode further includes a portion extending inwardly of the internal input/output conductive pattern,
an upper surface of the through-electrode is disposed on a level higher than a lower surface of the internal input/output conductive pattern, and
the upper surface of the through-electrode is disposed on a higher level than an upper end of the insulating spacer.

11. The semiconductor device of claim 1, wherein:
the first structure further includes an isolation layer defining a circuit active region and a dummy active region,
at least a portion of the first gate structure is disposed on the circuit active region, and
the first source/drain region is disposed in the circuit active region next to the first gate structure.

12. The semiconductor device of claim 11, wherein the through-electrode structure penetrates through the dummy active region and is spaced apart from the isolation layer.

13. The semiconductor device of claim 11, wherein the through-electrode structure penetrates through the isolation layer.

14. A semiconductor device comprising:
a semiconductor substrate having a first surface and a second surface opposing each other;
a back side insulating layer below the second surface of the semiconductor substrate;
an external input/output conductive pattern below the back side insulating layer;
a circuit device including a gate electrode and a source/drain region, on the first surface of the semiconductor substrate;
an internal input/output conductive pattern on the first surface of the semiconductor substrate, the internal input/output conductive pattern having at least a portion disposed on the same level as at least a portion of the gate electrode;
a through-electrode structure penetrating through the semiconductor substrate and the back side insulating layer and electrically connected to the internal input/output conductive pattern and the external input/output conductive pattern; and
a memory cell array region disposed on a level higher than the circuit device, on the first surface of the semiconductor substrate,
wherein each of the gate electrode and the internal input/output conductive pattern includes
a lower conductive pattern including a silicon layer, and
an upper conductive pattern.

15. The semiconductor device of claim 14, wherein:
the upper conductive pattern is arranged on the lower conductive pattern,
the through-electrode structure includes a through-electrode and an insulating spacer covering at least a portion of a side surface of the through-electrode,
the through-electrode further includes a portion extending inwardly of the internal input/output conductive pattern, and
an upper surface of the through-electrode is disposed on a higher level than a lower surface of the internal input/output conductive pattern and on a lower level than an upper surface of the internal input/output conductive pattern.

16. The semiconductor device of claim 15, wherein the upper surface of the through-electrode is disposed on a level higher than an upper end of the insulating spacer.

17. The semiconductor device of claim 15, wherein:
the upper conductive pattern is formed of one of a metal nitride, a metal, and a metal-semiconductor compound, or a combination of at least two thereof.

18. The semiconductor device of claim 14, further comprising:
a pattern structure;
an input/output connection wiring disposed on a level higher than the gate electrode;
a plurality of upper interconnections disposed on a level higher than the input/output connection wiring and disposed on height levels different from each other; and
an input/output contact plug disposed to be in contact with the input/output connection wiring and the internal input/output conductive pattern between the input/output connection wiring and the internal input/output conductive pattern, wherein:
the memory cell array region includes a plurality of gate layers, stacked while being spaced apart from each other in a vertical direction, and a vertical memory structure penetrating through the plurality of gate layers,
the plurality of gate layers are disposed below the pattern structure, and
the vertical memory structure is in contact with the pattern structure.

19. A data storage system comprising:
a main substrate;
a semiconductor device on the main substrate; and
a controller electrically connected to the semiconductor device on the main substrate, wherein:
the semiconductor device comprises:
a semiconductor substrate having a first surface and a second surface opposing each other;
a back side insulating layer below the second surface of the semiconductor substrate;
an external input/output conductive pattern below the back side insulating layer;
a circuit device including a gate electrode and a source/drain region, on the first surface of the semiconductor substrate;
an internal input/output conductive pattern on the first surface of the semiconductor substrate, the internal input/output conductive pattern having at least a portion disposed on the same level as at least a portion of the gate electrode;
a through-electrode structure penetrating through the semiconductor substrate and the back side insulating layer and electrically connected to the internal input/output conductive pattern and the external input/output conductive pattern; and
a memory cell array region disposed on a level higher than the circuit device, on the first surface of the semiconductor substrate,
wherein each of the gate electrode and the internal input/output conductive pattern includes
a lower conductive pattern including a silicon layer, and
an upper conductive pattern.

20. The data storage system of claim 19, wherein:
the upper conductive pattern is arranged on the lower conductive pattern,
the upper conductive pattern is formed of one of a metal nitride, a metal, and a metal-semiconductor compound, or a combination of at least two thereof,
the through-electrode structure includes a through-electrode and an insulating spacer covering at least a portion of a side surface of the through-electrode,
the through-electrode further includes a portion extending inwardly of the internal input/output conductive pattern,
an upper surface of the through-electrode is disposed on a higher level than a lower surface of the internal input/output conductive pattern and on a lower level than an upper surface of the internal input/output conductive pattern, and
the upper surface of the through-electrode is disposed on a level higher than an upper end of the insulating spacer.

* * * * *